(12) United States Patent
Geiger et al.

(10) Patent No.: US 9,738,966 B2
(45) Date of Patent: Aug. 22, 2017

(54) CHEMICALLY PURE ZERO-VALENT IRON NANOFILMS FROM A LOW-PURITY IRON SOURCE

(71) Applicant: Northwestern University, Evanston, IL (US)

(72) Inventors: Franz M. Geiger, Evanston, IL (US); Danielle Faurie-Wisniewski, San Antonio, TX (US)

(73) Assignee: Northwestern University, Evanston, IL (US)

( * ) Notice: Subject to any disclaimer, the term of this patent is extended or adjusted under 35 U.S.C. 154(b) by 0 days.

(21) Appl. No.: 14/844,612

(22) Filed: Sep. 3, 2015

(65) Prior Publication Data

US 2016/0068944 A1    Mar. 10, 2016

Related U.S. Application Data

(60) Provisional application No. 62/045,825, filed on Sep. 4, 2014.

(51) Int. Cl.
   *C23C 14/30*      (2006.01)
   *C23C 14/14*      (2006.01)

(52) U.S. Cl.
   CPC .............. *C23C 14/30* (2013.01); *C23C 14/14* (2013.01)

(58) Field of Classification Search
   None
   See application file for complete search history.

(56) References Cited

U.S. PATENT DOCUMENTS

| | | | |
|---|---|---|---|
| 3,860,450 A | 1/1975 | Nicolet et al. | |
| 5,021,084 A * | 6/1991 | Bianchi | C23C 14/0005 118/726 |
| 5,514,477 A * | 5/1996 | Ohashi | C23C 14/14 428/457 |
| 5,698,273 A | 12/1997 | Azad et al. | |
| 6,267,827 B1 * | 7/2001 | Shindo | H01F 41/183 148/310 |
| 2002/0117022 A1 * | 8/2002 | Uchikoshi | C23C 14/3414 75/10.22 |

FOREIGN PATENT DOCUMENTS

| | | |
|---|---|---|
| EP | 0534505 | 12/1998 |
| JP | 60-028028 | * 2/1985 |

(Continued)

OTHER PUBLICATIONS

Tatsuno JP60-028028 Feb. 1985 Eng machine translation.*

(Continued)

*Primary Examiner* — Joseph Miller, Jr.
(74) *Attorney, Agent, or Firm* — Bell & Manning, LLC

(57) ABSTRACT

Methods of forming chemically pure metal films are provided. The methods use electron beam deposition at a high mean deposition rate to form high purity metal films on deposition substrates. By using a high mean deposition rate, the melting point of the metal to be deposited is reached at the metal source surface during the deposition. As a result, the rate of transfer of impurities present in the metal source to the surface of the deposition substrate is so small that the deposited metal films are substantially free of impurity elements.

23 Claims, 18 Drawing Sheets

(56) References Cited

FOREIGN PATENT DOCUMENTS

| JP | 09027125 | 1/1997 |
|---|---|---|
| JP | 10140326 | 5/1998 |

OTHER PUBLICATIONS

English language machine translation of JP09027125, Jan. 28, 1997, Yuzo et al.

English language machine translation of JP10140326, May 26, 1998, Susumu et al.

Karcher et al., Turbulent heat transfer in liquid iron during electron beam evaporation, International Journal of Heat and Mass Transfer 43, 2000, pp. 1759-1766.

Westerberg et al., Finite Element Analysis of Flow, Heat Transfer, and Free Interfaces in an Electron-Beam Vaporization System for Metals, International Journal for Numberical Methods in Fluids 26, 1998, pp. 637-655.

Dikshit et al., Studies on Electron Beam Vapour Generation in PVD Processes, BARC Newsletter, Issue No. 314, May 2010, pp. 10-19.

E-Beam Evaporator—Operation Procedure | Nanofabrication Facility @ NCSU, webpage available online on or before Aug. 27, 2015, pp. 1-3.

Kurt J. Lesker Company | Iron Fe Pellets Evaporation Materials, webpage available online on or before Aug. 27, 2015, pp. 1.

Okoshi et al., F2-laser-induced surface modification of iron thin films to obtain corrosion resistance, Japanese Journal of Applied Physics 53, 022702, Jan. 14, 2014, pp. 1-5.

Faurie-Wisniewski et al., Synthesis and Characterization of Chemically Pure Nanometer-Thin Zero-Valent Iron Films and Their Surfaces, J. Phys. Chem. C 118, Sep. 10, 2014, pp. 23256-23263.

International Search Report and Written Opinion mailed in PCT/US2015/048326, Jan. 6, 2016.

* cited by examiner

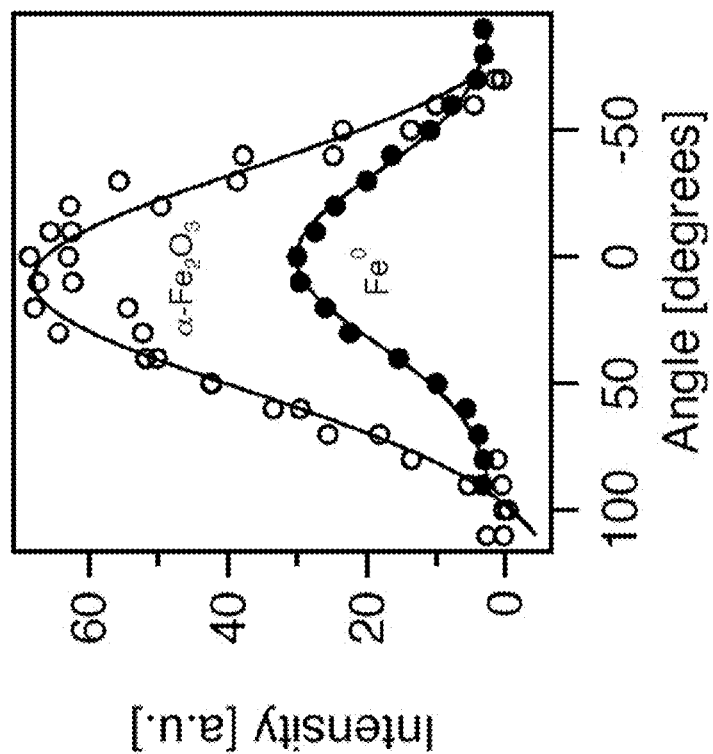
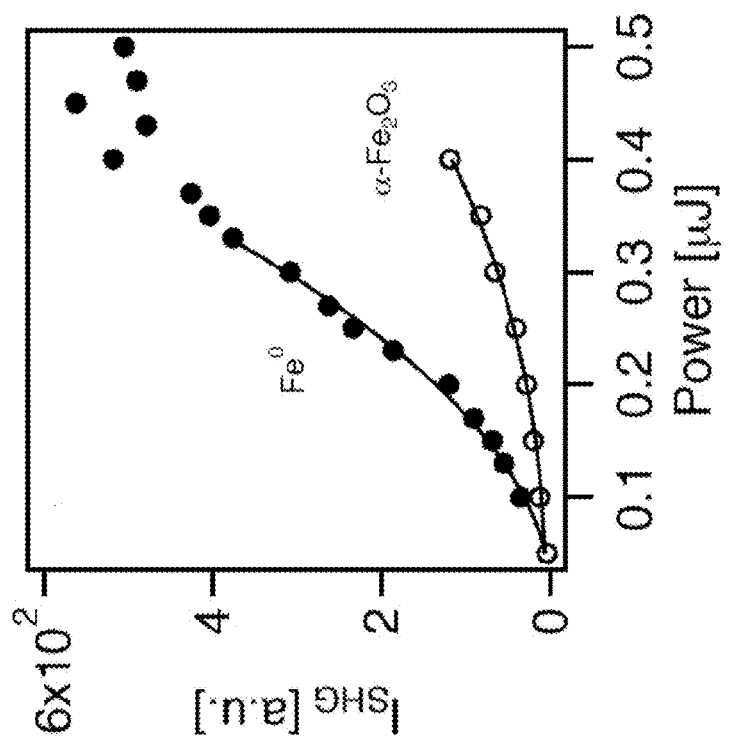
FIG. 6B
FIG. 6A

Material Type: Platinum, Pt    Analysis Type: Typical, PPM by Wt.

| Description: | | Purity: 99.99% | |
|---|---|---|---|
| Ag: 0.15 | Cu: 0.40 | N: | Si: 0.15 |
| Al: | F: | Na: | Sm: |
| Ar: | Fe: 4.5 | Nb: | Sn: |
| As: | Ga: | Ne: | Sr: |
| At: | Ge: | Ni: 0.40 | Ta: |
| Au: 0.60 | H: | O: | Tb: |
| B: | He: | Os: | Te: |
| Ba: | Hf: | P: | Th: |
| Be: | Hg: | Pb: 0.020 | Ti: |
| Bi: | I: | Pd: 0.80 | U: |
| Br: | In: | Pt: | V: |
| C: | Ir: 0.22 | Re: | W: |
| Ca: | K: | Rh: 3.7 | Y: |
| Cd: | Kr: | Rn: | Zn: |
| Ce: | La: | Ru: 0.090 | Zr: |
| Cl: | Li: | S: | |
| Co: | Mg: 0.057 | Sb: | |
| Cr: | Mn: | Sc: | |
| Cs: | Mo: | Se: | |

FIG. 7

Material Type: Palladium, Pd    Analysis Type: Typical, PPM by Wt.

Description:    Purity: 99.95%

| | | |
|---|---|---|
| Ag: | Cu: 1 | N: | Si: |
| Al: 2 | F: | Na: | Sm: |
| Ar: | Fe: | Nb: | Sn: |
| As: | Ga: | Ne: | Sr: |
| At: | Ge: | Ni: | Ta: |
| Au: 44 | H: | O: | Tb: |
| B: | He: | Os: | Te: |
| Ba: | Hf: | P: | Th: |
| Be: | Hg: | Pb: | Ti: |
| Bi: | I: | Pd: | U: |
| Br: | In: | Pt: | V: |
| C: | Ir: | Re: | W: |
| Ca: 3 | K: | Rh: | Y: |
| Cd: | Kr: | Rn: | Zn: |
| Ce: | La: | Ru: | Zr: |
| Cl: | Li: | S: | |
| Co: | Mg: | Sb: | |
| Cr: | Mn: | Sc: | |
| Cs: | Mo: | Se: | |

FIG. 8

Material Type: Iridium, Ir   Analysis Type: Typical,% by Wt.

| Description: | | Purity: 99.9% | | | |
|---|---|---|---|---|---|
| Ag: 0.0004 | Cu: | N: | | Si: | 0.0028 |
| Al: 0.0007 | F: | Na: | | Sm: | |
| Ar: | Fe: 0.0142 | Nb: | | Sn: | 0.0003 |
| As: 0.0064 | Ga: | Ne: | | Sr: | |
| At: | Ge: | Ni: | 0.0008 | Ta: | |
| Au: 0.0002 | H: | O: | | Tb: | |
| B: | He: | Os: | 0.0019 | Te: | 0.0005 |
| Ba: | Hf: | P: | | Th: | |
| Be: | Hg: | Pb: | 0.0018 | Ti: | 0.0023 |
| Bi: 0.0002 | I: | Pd: | 0.0007 | U: | |
| Br: | In: | Pt: | 0.0008 | V: | |
| C: | Ir: | Re: | | W: | |
| Ca: | K: | Rh: | 0.0476 | Y: | |
| Cd: | Kr: | Rn: | | Zn: | 0.0008 |
| Ce: | La: | Ru: | | Zr: | |
| Cl: | Li: | S: | | | |
| Co: 0.0002 | Mg: 0.0003 | Sb: | 0.0012 | | |
| Cr: 0.0005 | Mn: 0.0007 | Sc: | | | |
| Cs: | Mo: 0.0008 | Se: | | | |

FIG. 9

Material Type: Tungsten, W    Analysis Type: Typical, PPM by Wt.

Description:

| | | | |
|---|---|---|---|
| Ag: <0.01 | Cu: <0.01 | N: <20 | Si: 0.16 |
| Al: 0.03 | F: <0.5 | Na: 0.01 | Sm: <0.005 |
| Ar: <0.005 | Fe: 1 | Nb: 0.03 | Sn: <0.05 |
| As: 0.02 | Ga: <0.01 | Rb: <0.005 | Sr: <0.005 |
| Lu: <0.005 | Ge: <0.01 | Ni: 0.14 | Tm: <0.005 |
| Au: <0.05 | H: <10 | O: <50 | Tb: <0.005 |
| B: <0.001 | Nd: <0.005 | Os: <0.01 | Te: <0.01 |
| Ba: 0.07 | Hf: <0.005 | P: 0.17 | Th: <0.005 |
| Be: <0.001 | Hg: <0.1 | Pb: <0.01 | Ti: 0.03 |
| Bi: <0.01 | I: <0.01 | Pd: <0.01 | U: 0.003 |
| Br: <0.1 | In: <0.01 | Pt: <0.5 | V: 0.44 |
| C: <25 | Ir: <0.005 | Re: <0.05 | Yb: <0.005 |
| Ca: 0.1 | K: 0.02 | Rh: <0.005 | Y: 0.006 |
| Cd: <0.01 | Pr: <0.005 | Rn: Tl: <0.01 | Zn: <0.01 |
| Ce: 8.4 | La: 0.06 | Ru: <0.005 | Zr: <0.005 |
| Cl: <0.01 | Li: <0.005 | S: 0.006 | Dy: <0.005 |
| Co: 0.003 | Mg: <0.005 | Sb: <0.05 | Er: <0.005 |
| Cr: 1.3 | Mn: 0.006 | Sc: <0.001 | Eu: <0.005 |
| Cs: <0.01 | Mo: 2.1 | Se: <0.1 | Gd: <0.005 |

FIG. 10

Material Type: Rhodium, Rh    Analysis Type: Typical,% by Wt.

Description: 3-6mm Pieces, 25 Grams    Purity: 99.9%

| | | | |
|---|---|---|---|
| Ag: 0.0002 | Cu: 0.0002 | N: | Si: 0.0019 |
| Al: 0.0002 | F: | Na: | Sm: |
| Ar: | Fe: 0.0013 | Nb: | Sn: 0.0007 |
| As: 0.0005 | Ga: | Ne: | Sr: |
| At: | Ge: | Ni: 0.0002 | Ta: |
| Au: 0.0002 | H: | O: | Tb: |
| B: 0.0002 | He: | Os: 0.0002 | Te: 0.0003 |
| Ba: | Hf: | P: | Th: |
| Be: | Hg: | Pb: 0.0002 | Ti: 0.0002 |
| Bi: 0.0004 | I: | Pd: 0.0004 | U: |
| Br: | In: | Pt: 0.0003 | V: 0.0002 |
| C: | Ir: 0.001 | Re: | W: |
| Ca: 0.0021 | K: | Rh: 99.99 | Y: |
| Cd: 0.0002 | Kr: | Rn: | Zn: 0.0002 |
| Ce: | La: | Ru: 0.0002 | Zr: 0.0002 |
| Cl: | Li: | S: | |
| Co: 0.0002 | Mg: 0.0004 | Sb: 0.0004 | |
| Cr: 0.0003 | Mn: 0.0002 | Sc: | |
| Cs: | Mo: 0.0002 | Se: 0.0002 | |

FIG. 11

Material Type: Gold, Au     Analysis Type: Typical, PPM by Wt.

Description:     Purity: 99.9%

| | | | |
|---|---|---|---|
| Ag: 2 | Cu: 2 | N: | Si: 1 |
| Al: 11 | F: | Na: 1 | Sm: |
| Ar: | Fe: | Nb: | Sn: |
| As: | Ga: | Ne: | Sr: |
| At: | Ge: | Ni: | Ta: |
| Au: | H: | O: | Tb: |
| B: 1 | He: | Os: | Te: |
| Ba: | Hf: | P: | Th: |
| Be: | Hg: | Pb: | Ti: |
| Bi: | I: | Pd: | U: |
| Br: | In: | Pt: 17 | V: |
| C: | Ir: | Re: | W: |
| Ca: | K: | Rh: | Y: |
| Cd: | Kr: | Rn: | Zn: 1 |
| Ce: | La: | Ru: | Zr: |
| Cl: | Li: | S: | |
| Co: | Mg: | Sb: | |
| Cr: | Mn: | Sc: | |
| Cs: | Mo: | Se: | |

FIG. 12

| Material Type: Osmium, Os | | Analysis Type: Typical, PPM by Wt. | |
|---|---|---|---|
| Description: | | Purity: 99.98% | |
| Ag: <10 | Cu: <10 | N: | Si: 10 |
| Al: <10 | F: | Na: | Sm: |
| Ar: | Fe: 30 | Nb: | Sn: <10 |
| As: <10 | Ga: | Ne: | Sr: |
| At: | Ge: | Ni: <10 | Ta: |
| Au: <10 | H: | O: | Tb: |
| B: | He: | Os: | Te: <10 |
| Ba: | Hf: | P: | Th: |
| Be: | Hg: | Pb: <10 | Ti: |
| Bi: <10 | I: | Pd: <10 | U: |
| Br: | In: | Pt: 10 | V: |
| C: | Ir: 10 | Re: | W: 10 |
| Ca: <10 | K: 50 | Rh: <10 | Y: |
| Cd: | Kr: | Rn: | Zn: 10 |
| Ce: | La: | Ru: <10 | Zr: |
| Cl: | Li: | S: | : |
| Co: <10 | Mg: <10 | Sb: <10 | : |
| Cr: <10 | Mn: <10 | Sc: | : |
| Cs: | Mo: <10 | Se: | : |

FIG. 13

CHEMICALLY PURE ZERO-VALENT IRON NANOFILMS FROM A LOW-PURITY IRON SOURCE

CROSS-REFERENCE TO RELATED APPLICATIONS

The present application claims priority to U.S. provisional patent application No. 62/045,825 that was filed on Sep. 4, 2014, the entire contents of which are hereby incorporated by reference.

REFERENCE TO GOVERNMENT RIGHTS

This invention was made with government support under CHE0950433 and CHE1464916 awarded by the National Science Foundation. The government has certain rights in the invention.

BACKGROUND

Iron films of nanometer thickness are of interest because of a variety of potential applications in catalysis,[1] environmental remediation,[2] optics,[3] data storage,[4] corrosion inhibition,[5] as well as their potential relevance in consumer electronics and coatings products. While many processes that render thin iron films functional occur at their surfaces, their interrogation by spectroscopic probes is often limited by the "strong-absorber" problem associated with macroscopically thick samples of iron and its oxides,[6,7] especially in situations where one would like to probe the surface from the iron side. While this issue can, in principle, be overcome with the use of iron films that are thin enough so that light fields are readily transmitted through them, nm thin films have not yet been demonstrated to be of high chemical purity. Moreover, the synthesis of corrosion-resistant iron thin films,[5] which are considered to be of high purity once an oxide overlayer is formed, requires high-purity iron sources that are expensive and/or difficult to obtain.

Previous methods used to deposit iron thin films from a metallic iron source[5,8,9] employ physical vapor deposition (PVD) techniques, including pulsed laser deposition (PLD),[8] thermal evaporation under low vacuum conditions,[9] magnetron sputtering,[10] and electron beam (E-Beam) deposition.[5] Laser and E-Beam deposition processes employ light and particle sources that ablate ions from an iron source to a flat substrate under UHV conditions,[11] whereas thermal evaporation involves heating a crucible holding the iron source, followed by the deposition of evaporating atoms onto a substrate.[12] Of the PVD methods used to prepared thin iron films, magnetron sputtering can provide the highest sputtering rates. The deposition of corrosion-resistant iron films has been thought to require the use of iron sources having a purity of at least 5N (99.999% Fe), which are difficult to obtain[5] and handle.[5,13] Moreover, because of iron's high boiling point (2862° C.),[14] impurities with lower boiling points, such as zinc or alkali elements,[15] if present in the iron source, are expected to be enriched in the gas phase during low-temperature PVD processes and to therefore coat the substrate to a disproportionally larger extent when compared to their abundance in the bulk iron source.

SUMMARY

Methods of forming chemically pure metal films using electron beam evaporation are provided.

One embodiment of a method of forming a metal film comprises the step of directing an electron beam onto the surface of a metal source comprising 99.98 atomic percent, or less, of a source metal element to be deposited; the remainder of the metal source comprising impurity elements having boiling points lower than that of the source metal element at the deposition conditions. The electron beam heats the surface of the metal source to a temperature above its melting point, such that at least a portion of the surface of the metal source melts and source metal and impurities from the melted metal source evaporate into the gas phase and then deposit as a solid film on a surface of the deposition substrate. The temperature to which the metal source is heated by the electron beam is high enough that the concentration of the impurities in the gas phase is the same as, or lower than, the concentration of the impurities in the metal source. As a result, the solid film deposited on the deposition substrate has an impurity concentration that is the same as, or lower than, that of the metal source. The metal source may by an iron source and the metal film may comprise substantially pure iron.

Some embodiments of the methods are conducted using a metal source comprising 99.95% of the metal to be deposited (3N5 purity) (the source metal), or lower, the remainder of the metal source comprising the one or more impurity elements. Even when such low purity metal sources are used, the deposited solid metal film is substantially pure source metal.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings.

FIG. 6A. SHG response of ZVI films (colored circles) in the presence of pH 7 Millipore water and α-Fe$_2$O$_3$ (empty circles) in the presence of pH 4 Millipore water (300 nm SHG) as a function of power using the p-in/all-out polarization combination.

FIG. 6B. SHG response of ZVI films (colored circles) in the presence of pH 7 Millipore water and α-Fe$_2$O$_3$ (empty circles) in the presence of pH 4 Millipore water (300 nm SHG) as a function of polarizer angle.

FIG. 7. Table of impurity elements commonly found in a platinum source.

FIG. 8. Table of impurity elements commonly found in a palladium source.

FIG. 9. Table of impurity elements commonly found in a iridium source.

FIG. 10. Table of impurity elements commonly found in a tungsten source.

FIG. 11. Table of impurity elements commonly found in a rhodium source.

FIG. 12. Table of impurity elements commonly found in a gold source.

FIG. 13. Table of impurity elements commonly found in a osmium source.

DETAILED DESCRIPTION

Figure 1:
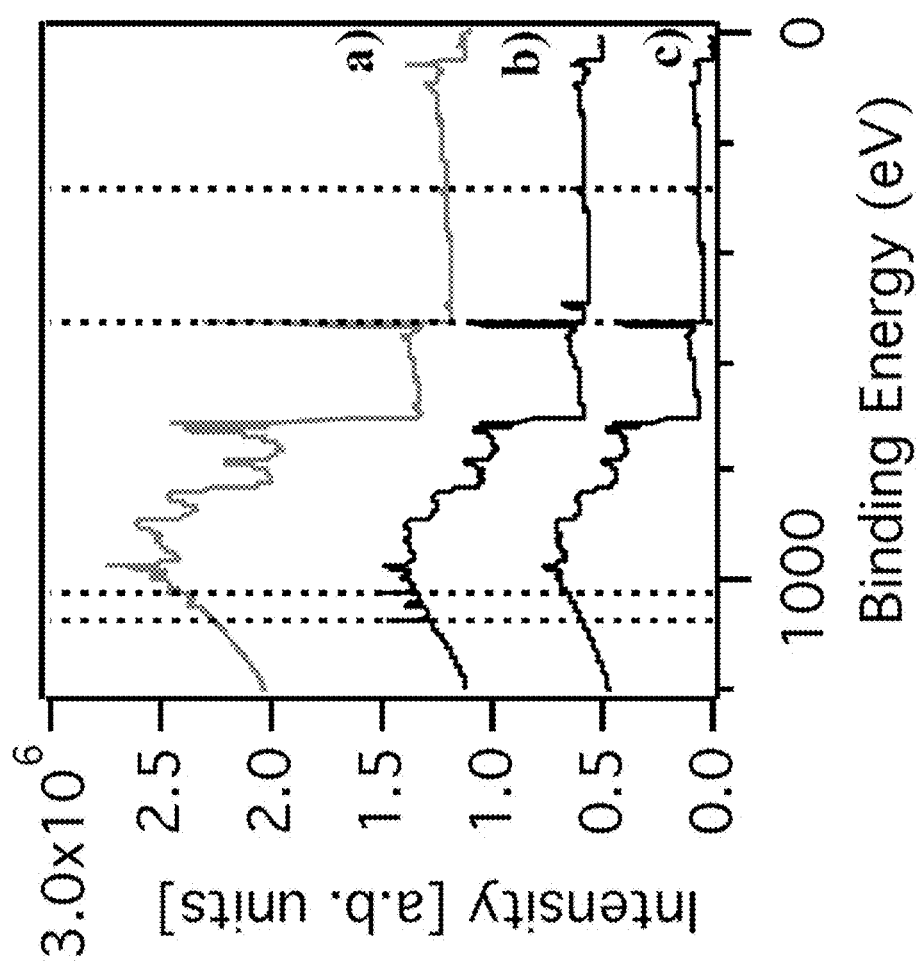
FIG. 1. XPS survey spectra of hematite (offset by $1.1 \times 10^6$ counts) (a); an iron thin film deposited at a rate of 0.18 nm/sec using E-Beam deposition (offset by $5 \times 10^5$ counts) (b); and an iron thin film deposited at a rate of 0.52 nm/sec using E-Beam deposition. The dashed lines represent, from left to right, peak positions for Na 1s, Zn 2p, O 1s, and C 1s (c).

Methods of forming chemically pure metal films are provided. The methods use electron beam deposition at a high mean deposition rate to form ultra-high purity metal films on deposition substrates and can employ even relatively low purity metal sources. These low purity sources are comprised primarily of the metal element to be deposited (referred to as the source metal), but also contain significant concentrations of undesirable impurity elements, at least some of which have lower boiling points at the deposition conditions than the source metal.

The invention is based, at least in part, on the discovery that melting the surface of the metal source with the electron beam during the deposition, and then evaporating the source metal from the melted portion of the substrate surface at a sufficiently high temperature, results in the deposition of a film of the source metal element having a purity that is at least as high as, and in some embodiments is higher than, the purity of the metal source. Therefore, the present methods are able to provide metal (or metal oxide, after oxidation) thin films for high-end applications using relatively cheap and impure metal sources. Notably, the present methods make it possible to deposit films of source metals that are as pure as, or purer than, films deposited from higher purity metal sources. Previously, it was believed that the purity of a metal film deposited via electron beam evaporation would be lower than the purity of the metal source from which it was formed due to the enrichment of lower boiling point impurities during physical vapor deposition and, therefore, that the metal source needed to be at least as pure as the desired purity of the deposited film.

In some embodiments, the temperature to which the metal source is heated by the electron beam is high enough that mass transfer from the metal source to the deposition substrate enriches the deposited film with the source metal, relative to the metal source. In some embodiments, the temperature to which the metal source is heated by the electron beam is at least as high as the boiling point of the source metal. In some embodiments, the temperature to which the metal source is heated by the electron beam is at least 5° C. higher than the surface melting temperature of the source metal; at least 10° C. higher than the surface melting temperature of the source metal; at least 20° C. higher than the surface melting temperature of the source metal; at least 50° C. higher than the surface melting temperature of the source meta; or at least 100° C. higher than the surface melting temperature of the source metal, at the deposition conditions.

In some embodiments of the present methods, the deposited metal film has a purity that is at least 0.01000% higher than the purity of the metal source. This includes embodiments in which the deposited metal film has a purity that is at least 0.02000% higher than the purity of the metal source and further includes embodiments in which the deposited metal film has a purity that is at least 0.03000% higher than the purity of the metal source. For example, the present methods can be used to deposit a metal film that is at least 99.98% pure (based on atomic percent) from a metal source that is no greater than 99.95% pure.

The local melting of the metal source surface by the electron beam can be accomplished by using a high mean deposition rate in a vacuum chamber that has been evacuated to a very low chamber pressure. In some embodiments of the methods, the vacuum chamber is evacuated to a pressure of 9×10$^{-6}$ or lower, 5×10$^{-6}$ or lower, or 1×10$^{-6}$ or lower. Other conditions that facilitate the deposition of a high purity metal film include electron beam deposition currents in the range from 30 mA to 140 mA and electron beam wattages in the range from about 150 to about 665 watts. As a result, the rate of transfer of impurities present in the metal source to the surface of the deposition substrate (also referred to as the deposition target) is so small that the deposited metal films are substantially free of elements other than the source metal. As used herein, the phrases "substantially free of elements other than the source metal" and "substantially pure source metal" means that elements other than the source metal are not detectable by X-ray photoelectron spectroscopy, under the conditions described in the Example.

The deposited metal films may be thin films with thicknesses of no greater than about 200 nm. For example, the metal films can be deposited with thicknesses in the range from about 10 to about 100 nm.

The methods are particularly well suited for the deposition of ultra-high purity iron films. Notably, the electron beam deposition methods do not require the use of iron sources having a purity grade of 5N (99.999%) or higher in order to provide chemically pure, zero valent iron films. The iron sources used in the electron beam deposition may have iron purity grades of less than 99.99% (4N purity) and still provide iron films that are substantially pure iron. Various embodiments of the methods use iron sources having a purity of no greater than 99.98% (3N8), no greater than 99.97% (3N7), no greater than 99.96% (3N6) and no greater than 99.95% (3N5). For example, iron sources having iron purities in the range from about 99.93% to about 99.98% can be used. However, iron sources having higher or lower iron purity grades can also be employed.

The thin films may be hard and smooth, with smoothness generally increasing as film thickness decreases. In some embodiments, the metal films are iron films having a nanoindentation hardness of at least about 7 GPa. In some embodiments, the metal films are iron films having an average surface roughness of no greater than about 0.3 nm. This includes embodiments of the metal films that are iron films having an average surface roughness of no greater than about 0.2 nm.

Other substantially pure metal films that can be deposited from relatively low purity metal sources, including metal sources having a purity of no greater than 4N, no greater than 3N8, no greater than 3N7, no greater than 3N6 and no greater than 3N5, are precious metal films. Some embodiments of the present methods are used to deposit metal films of substantially pure platinum, palladium, iridium, tungsten, rhodium, gold, and osmium. Tables listing the types and amounts of impurity elements found in commercially available sources for each of these metals are provided in FIGS. 7, 8, 9, 10, 11, 12 and 13, respectively. These illustrative examples were provided for metal sources commercially available from Kurt J. Lesker, Co. Using the present methods, the impurities listed in the tables can be eliminated to substantially eliminated to provide deposited films that are substantially pure source metal.

Common impurities in iron sources, and other metal sources, include elements that have lower boiling points than iron. Such elements include zinc and alkali elements, such as sodium. Therefore, the present methods can be used to form metal films that are substantially free of these elements. The impurity elements in a metal source may be present in the metal source at concentrations of at least 0.1 ppm by weight and still be undetectable in the final deposited metal film.

If the deposited films are maintained in a non-oxidizing environment, they can be maintained as ultra-high purity metal films. However, many of the metal films will oxidize when exposed to an oxidizing environment to provide ultra-high purity metal oxide overlayer comprising substantially pure oxides of the source metal on their surfaces. For some applications this is desirable, as in the case of the ultra-high purity iron films which form a protective, oxidation-resistant coating. When the deposited iron films are exposed to an oxidizing environment, an amorphous oxide overlayer forms on the iron film. The amorphous oxide overlayer may comprise $Fe_3O_4$ and other iron oxides and may be free of other amorphous iron oxide phases. The oxide layers will generally remain quite thin, with thicknesses of, for example, 5 nm or less.

Substrates to which the high purity metal coatings or metal oxide coatings can be applied include substrates for which high purity coatings are required in order to perform their primary function. Example include, metal or ceramic turbine blades and semiconductor (e.g., silicon) wafers. For example, the thin films can be used as conducting lines in microelectronic devices. Other applications for the deposited metal films include corrosion-resistant decorative or functional metal coatings on consumer products. Additional applications for the deposited metal films include those requiring metal films that are transparent at optical and other frequencies, including those used in optoelectronic devices and sensing devices (sensors) for sensing analytes of biological or other nature, or of external stimuli, including temperature, pH, ionic strength, pressure, relative humidity, or electromagnetic radiation of various wavelengths Unless otherwise specified, any numerical values recited for the chemical or physical properties of the iron films refer to values measured according to the techniques described in the Example.

EXAMPLE

I. Summary

This example illustrates a method to fabricate, using electron beam (E-Beam) deposition, nm-thin continuous iron films that are shown by a variety of characterization techniques, to be chemically pure, i.e. void of contaminants like Zn or Na, even though the iron source is only 99.95% pure, and to contain an iron oxide layer of 3-5 nm thickness whose surface charge density is determined for pH 7 using nonlinear optics.

This example presents a study with the goals to (1) fabricate chemically pure iron thin films from iron sources that are readily available, (2) fully characterize the films to analyze chemical and morphological properties, and (3) employ nonlinear spectroscopic techniques to study the optical properties of the film surface. Specifically, a method has been developed to fabricate optically smooth, nm-thin films of chemically pure iron using E-Beam deposition from a 3N5 (99.95%) iron source, contrary to previous studies[5,16], eliminating the need for a 5N iron source, or high rates of magnetron sputtering, to achieve such high purity. This is confirmed via X-Ray photoelectron spectroscopy (XPS), reported here for the first time for the entire relevant range of elements. X-Ray diffraction and Raman spectroscopic studies were also conducted to analyze the bulk sample composition. Atomic force microscopy (AFM) was employed to assess the morphological properties of the surface in order to conduct nonlinear optical studies of the thin film surfaces under water using second harmonic generation (SHG).

II. Materials and Methods

A. Materials. ⅛" dia. by ⅛" long iron pellets (99.95%) and 4 $cm^3$ $Al_2O_3$ crucibles used in the deposition were obtained from Kurt J. Lesker, Co. Two iron batches were used in this experiment, with batch #1 (LOT #:FE39853159/VPU099237) purchased approximately one year prior to experimentation and batch #2 (LOT#: FE39863811/VPU112993) purchased within days of deposition, characterization, and experimentation. The data sheets displaying impurities present in the iron are provided in the tables below.

| Material Type: Fe Lot Number FE29863811 | | Analysis Type: PPM by Wt Date: Oct. 30, 2013 | |
|---|---|---|---|
| Ag: <0.05 | Cu: 1.2 | N: 1 | Si: 44 |
| Al: 10 | F: <0.01 | Na: 0.16 | Sm: 0.005 |
| Ho: <0.005 | Nd: <0.005 | Nb: <1 | Sn: <0.05 |
| As: 0.22 | Ga: 0.74 | Tm: <0.005 | Sr: <0.2 |
| Lu: <0.005 | Ge: 9.6 | Ni: 12 | Ta: <10 |
| Au: <0.05 | Pr: <0.005 | O: 84 | Tb: <0.005 |
| B: 3.5 | Rb: <0.5 | Os: <0.01 | Te: <0.01 |
| Ba: <0.05 | Hf: <0.01 | P: 7.2 | Th: <0.005 |
| Be: <0.005 | Hg: <0.05 | Pb: <0.01 | Ti: 0.54 |
| Bi: 0.005 | I: <0.01 | Pd: <0.05 | U: <0.005 |
| Br: <0.1 | In: <0.01 | Pt: <0.05 | V: 0.04 |
| C: 27 | Ir: <0.05 | Re: <0.01 | W: <0.05 |
| Ca: <0.05 | K: 0.16 | Rh: <0.05 | Y: <0.05 |
| Cd: <0.01 | Tl: <0.01 | Yb: <0.005 | Zn: 0.27 |
| Ce: <0.05 | La: <0.01 | Ru: <0.1 | Zr: <1 |
| Cl: 0.17 | Li: 0.03 | S: 7 | Dy: <0.005 |
| Co: 19 | Mg: 0.03 | Sb: <0.05 | Er: <0.005 |
| Cr: 3.8 | Mn: 1.5 | Sc: <0.005 | Eu: <0.005 |
| Cs: <0.01 | Mo: 0.34 | Se: <0.05 | Gd: <0.005 |

| Material Type: Fe Lot Number FE29863811 | | Analysis Type: PPM by Wt Date: Dec. 21, 2012 | |
|---|---|---|---|
| Ag: | Cu: 3.8 | N: <10 | Si: 65 |
| Al: 12 | F: <0.01 | Na: 0.3 | Sm: |
| Ar: | Fe: | Nb: 0.04 | Sn: 0.17 |
| As: 0.23 | Ga: | Ne: | Sr: |
| At: | Ge: | Ni: 1.2 | Ta: |
| Au: | H: <3 | O: 40 | Tb: |
| B: 1.7 | He: | Os: | Te: |
| Ba: | Hf: | P: 6.5 | Th: |
| Be: | Hg: | Pb: <0.005 | Ti: 1.6 |
| Bi: | I: | Pd: | U: |
| Br: | In: | Pt: | V: 0.09 |
| C: 21 | Ir: | Re: <0.01 | W: <0.05 |
| Ca: 0.06 | K: | Rh: | Y: |
| Cd: | Tl: | Yb: | Zn: 0.21 |
| Ce: | La: | Ru: | Zr: |
| Cl: 0.06 | Li: | S: 12 | Dy: |
| Co: 6 | Mg: 0.04 | Sb: 0.04 | Er: |
| Cr: 2.6 | Mn: 7.8 | Sc: | Eu: |
| Cs: | Mo: 0.4 | Se: | Gd: |

Microscope slides were purchased from VWR (CAT No. 48300-025). For the laser spectroscopy experiments, 25.4 mm dia., 1.0 mm thick IR grade, fused silica windows (Part No. QI-W-25-1) and 25.4 mm dia. UV grade fused silica hemispheres (Part No. QU-HS-25) were purchased from ISP Optics.

B. Iron Deposition. Prior to deposition the microscope and/or silica substrates were covered in NoChromix® for one hour and then rinsed with copious amounts of Millipore water. The substrate was then immersed in methanol for 6 minutes, placed in a 120° C. oven for 30 minutes, and finally placed into an $O_2$ plasma cleaner (Harrick) for 30 seconds on the highest power. The substrates were then mounted onto the sample holder in an Edwards Auto 500 FL400 E-beam Evaporator. The iron metal was placed into the $Al_2O_3$ crucible and the instrument was evacuated until a pressure of at least $9 \times 10^{-6}$ Torr was reached. A tungsten filament served as the electron beam source with a beam diameter of approximately 3 mm. The deposition parameters for iron included the density ($\rho$=7.86 g/cc) and the acoustic impendence ($25.29 \times 10^5$ g/cm$^2$·s). In this work, we prepared iron films having thicknesses of 15, 25, 50, and 70 nm with deposition rates ranging from 0.15-0.70 nm/sec, as described in detail below. The film thicknesses were measured in situ using a quartz crystal microbalance and offline via ellipsometry.

C. X-Ray Photoelectron Spectroscopy (XPS). XPS measurements were carried out using a Thermo Scientific ESCALAB 250Xii. The instrument utilized Kα radiation from a monochromatic aluminum source and was calibrated to give a binding energy of 83.96 eV for the Au $4f_{7/2}$ line. A flood gun was employed to compensate for charge at the surface by ejecting low energy $Ar^+$ ions and electrons. Narrow scans were taken with a pass energy of 10 eV and a step size of 0.05 eV. Charge correction was made by adjusting the XPS peaks to the 284.8 eV carbon peak. To calculate the atomic percentages of the various surface species, peak fitting was conducted following background subtraction using the software's smart background function, which is based on a modified Shirley background function, using the Advantage v.5 software with a 70/30 mix of Gaussian-Lorentzian functions.

In addition to narrow and survey scans of the surface, a depth study was also conducted in order to probe for the presence of any oxide layer that may have formed on the thin film surface. At higher $Ar^+$ energies (3 keV) $Fe^{+3}$ is readily reduced to $Fe^{+2}$,[17] which is further elaborated on later. To avoid this phenomenon, these experiments employed a 2 keV etching mode ion ($Ar^+$) gun at mid current with a 2 mm raster size. After each etch (15-30 seconds) the gun was turned off to analyze the iron, oxygen, silicon, and carbon content at that depth. Peak fitting was then performed as described above to determine how the atomic percentage of each element changed as a function of depth.

D. XRD, Raman Spectroscopy, and AFM. Grazing incidence angle X-Ray diffraction (GIAXRD) experiments were performed using a Rigaku Smartlab Thin-Film Diffraction Workstation. This instrument uses a 9 kW copper rotating anode X-ray source coupled to a multilayer optic allowing for selectable X-ray optical configurations. Raman analysis was collected on a Renishaw Ramascope. One spectrum was recorded with a 633 nm excitation while the other was with a 785 nm excitation wavelength. The data was collected with a 50× objective, 100% laser power (50 mW), a 100-2000 cm$^{-1}$ range, and an acquisition time of 30 seconds. Atomic force microscope (AFM) images were taken in tapping mode using a Bruker Dimension FastScan® to analyze roughness and morphological structures on the film surface. Images were taken with a scan rate of 2 Hz and analyzed using Nanoscope® v. 9.0.

E. Nanoindentation Experiments. Nanoindentation[18] experiments to test how hard the iron films are compared to bulk iron or the glass substrates were conducted using a Hysitron TI 950 TriboIndenter calibrated to a standard quartz sample. A diamond Berkovitch probe was used for indentation. The experiments were performed in feedback-based displacement control mode for a precise indentation depth of 15 nm, thus eliminating any substrate effects in our measurements. Hardness values were determined from the force displacement curves for a 70 nm thin film at 4 different locations near the center of the film and compared to the average of three values determined for a free portion of the microscope glass slide on which the iron film had been deposited.

F. SHG, Laser, and Flow System. Metal surfaces have been probed extensively using nonlinear optics, and corrosion processes occurring there were studied in the pioneering work of Baldelli and coworkers.[19-21] To further characterize any oxide layer that may have formed on the thin film surface, specifically upon submerging the iron films into water, second harmonic generation,[22-26] specifically the $\chi^{(3)}$ technique, was employed as it yields estimates of the electrostatic potential ($\Phi_0$) of oxide/water interfaces at zero distance from the surface, according to $$E_{SHG} \propto P_{2\omega} = \chi^{(2)} E_\omega E_\omega + \chi^{(3)} E_\omega E_\omega \Phi_0 \qquad \text{Eqn. 1}$$

Here, $E_{SHG}$ represents the SHG electric field, $P_{2\omega}$ is the induced second-order polarization, $\chi^{(2)}$ and $\chi^{(3)}$ are the second- and third-order nonlinear susceptibility tensors, and $E_\omega$ is the incident electric field at frequency $\omega$.[23,25,27,28] Under the experimental conditions employed here, $\chi^{(2)}$, $\chi^{(3)}$, and $E_\omega$ are assumed to be constant.[28] By employing the Gouy-Chapman model to express the interfacial potential as a function of surface charge density and electrolyte concentration, the SHG signal intensity can be expressed according to Eqn. 2.[29-31]

$$\sqrt{I_{2\omega}} = |E_{2\omega}| \propto A + B * \sinh^{-1}\left((\sigma) \frac{30.147 M^{1/2} \text{m}^2 C^{-1}}{\sqrt{C_{NaCl}}}\right) \qquad \text{Eqn. 2}$$

Here, A and B are fit parameters composed of constants from Eqn. 1, $I_{2\omega}$ is representative of SHG intensity, $\sigma$ is the net surface charge density in C/m², and $C_{NaCl}$ is the total concentration of NaCl.

The laser and detection system employed here are explained in detail elsewhere.[6,32-35] Briefly, we used a regeneratively amplified Ti:Sapphire laser system (1 kHz, 120 fsec, 800 nm, 1 W, Hurricane, Spectra Physics) pumping an optical parametric amplifier (OPA-CF, Spectra Physics) to produce a fundamental at frequency $\omega$ set to range between 595 and 606 nm. The pulse energy was adjusted to 0.135(5) microJ, which control experiments show is below the optical breakdown (vide infra). The beam was then focused to a spot size of approximately 30 µm in diameter at an angle of 60° onto the thin film/water interface, which is just below total internal reflection conditions. Following optical isolation, the second harmonic (2ω) photons were detected using single photon counting. The SHG measurements were carried out under flow conditions similar to previously published work.[6,36,37] A fused silica window coated on a single side with a 26.7(5) nm (as determined by ellipsometry) thin iron film was placed onto a Viton O-ring to form a leak proof seal with the analyte and then covered with a small amount of Millipore water to ensure efficient light transmission into and out of a fused silica hemisphere clamped on top of the iron film-containing fused silica window. A ring of Millipore water was placed around the hemisphere and the window to prevent water evaporation from the region between the window and the hemisphere. A dual pump system was employed to cycle solution from two different reservoirs, one containing pure pH 7 Millipore water and one containing varying concentrations of NaCl, also held at pH 7. The flow rate was monitored using a flow meter and adjusted to approximately 1 mL/s.

III. Results and Discussion

A. Impurity Concentration Decreases as a Function of Deposition Rate. The iron source employed here contains impurities that are prevalent at low deposition rates (less than 0.2 nm/sec), but vanish to immeasurable amounts as the deposition rate increases. To fully characterize the synthesized films, a direct comparison to $\alpha$-Fe$_2$O$_3$ characterization studies, previously published,[6] was conducted due to the presence of Fe$^{+3}$ on our films. FIG. 1, traces (c) and (b), present the XPS survey scan of a 10-nm thick film of $\alpha$-Fe$_2$O$_3$, an iron thin film deposited on a slide at a rate of 0.52 nm/sec and at a rate of 0.18 nm/sec, respectively. FIG. 1, trace (a), shows the XPS survey scan of hematite. The $\alpha$-Fe$_2$O$_3$ and thin film sample deposited at higher deposition rates show only XPS peaks relevant to iron in the Fe 2p (705-730 eV), O 1s (526-538 eV), and the C 1s (280-290 eV) binding regions.[38] At lower deposition rates, impurities present within the bulk metal source are present as shown by the presence of Zn (1021.7 eV) and Na (1071 eV) in the XPS spectra.[38] The boiling points for sodium and zinc are 882.9° C. and 905.7° C.,[15] respectively, while iron's boiling point is 2862 ° C.[14] Given that the vapor pressure of a material at evaporation temperature is proportional to the evaporation rate of the source,[39,40] impurities in the deposited film can be avoided at a higher deposition rate, for which a higher electron current is necessary, as established herein. It was clear that evaporation of the iron, rather than the impurities, took place due to the deformation of the small pellets.

Figure 2A:
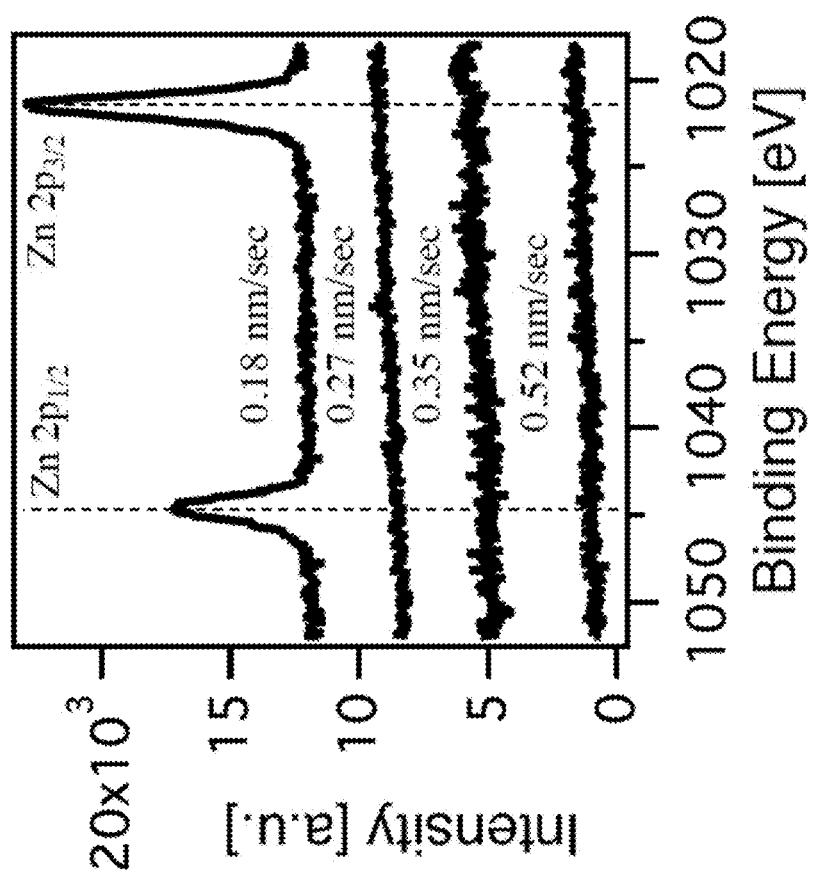
FIG. 2A. Narrow scans in the Zn 2p region for iron thin films deposited at various rates via E-beam deposition.
Figure 2B:
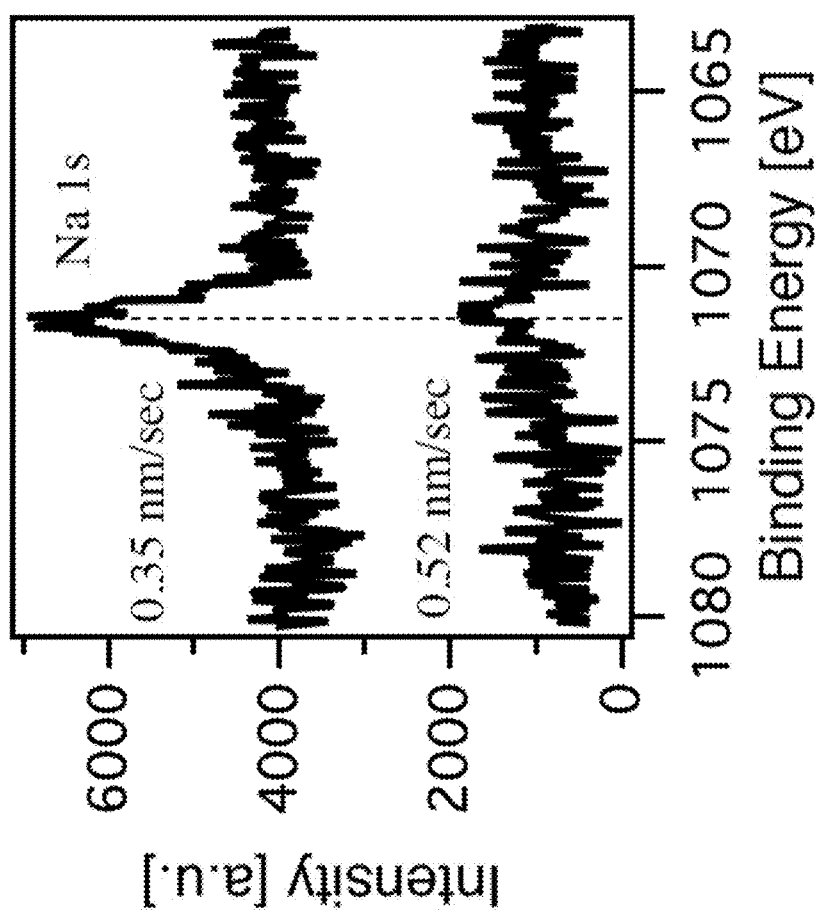
FIG. 2B. Narrow scans in the Na 1s region for iron thin films deposited at various rates via E-beam deposition.
Figure 2C:
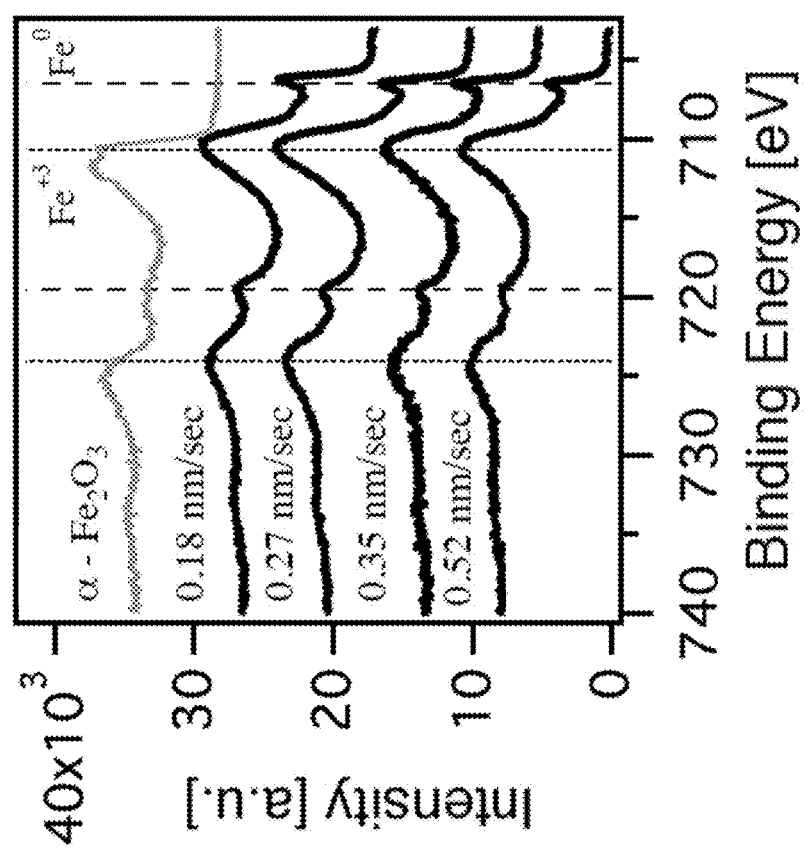
FIG. 2C. Narrow scans in the Fe region for iron thin films deposited at various rates via E-beam deposition. The Fe 2p narrow scan also includes a comparison to $\alpha\text{-Fe}_2O_3$ for reference.[6]

FIG. 2 shows XPS narrow scans in the Zn 2p, Fe 2p, and Na 1s regions for films deposited at various deposition rates. At a deposition rate of 0.18 nm/sec we find Zn impurities (FIG. 2A),[41] but increasing the deposition rate leads to immeasurable amounts of Zn, as observed in the survey scans. Sodium impurities persist at higher deposition rates, as shown in FIG. 2B, but at the highest deposition rate (0.52 nm/sec) the concentration also decreases to immeasurable amounts. The sodium likely persists at higher deposition rates due to the higher concentration of sodium in the bulk when compared to zinc. Complementary experiments show that the presence of carbon in the XPS spectra disappears upon sputtering with Ar$^+$ for just 15 seconds. Taken together, we conclude that the iron films are chemically pure.

The Fe 2p narrow scan (FIG. 2C) shows that the relative abundances of the two prevalent iron species, Fe$^{+3}$ and Fe$^0$,[42,43] do not differ as a function of deposition rate. Fe(III) signals are expected given that it is well understood that Fe$^0$ oxidizes to Fe$^{+2}$ and Fe$^{+3}$ upon exposure to air.[2,44] When compared to $\alpha$-Fe$_2$O$_3$, the XPS spectra of the thin iron films studied here do not exhibit the small step in the low energy binding side of the Fe 2p$_{3/2}$ peak that is characteristic of hematite,[6,45] indicating the presence of a different Fe(III) oxide. In addition to the Fe$^{+3}$ peaks, the XPS spectra of the iron film surface also show Fe$^0$ (ZVI) peaks at 706.5 eV and 719.5 eV,[5,43] which have not been observed before. Peak fitting of the Fe$^3$, Fe$^0$, and O 1s peaks for all deposition rates shows that the average atomic percentage of Fe$^0$ on the surface of the sample is 11(4)%. While XPS is a surface specific technique, photoelectrons can escape from regions up to 30 Å below the surface.[42] The presence of Fe$^0$ peaks in the XPS spectra then indicates the presence of Fe$^0$ within a surface oxide layer that is as thin as or thinner than the inelastic mean free path of a 10 eV electron.

B. Depth Studies Confirm the Presence of ZVI Below the Oxide Surface Layer. As discussed in the previous section, the XPS spectra indicate the presence of Fe$^{+3}$ and Fe$^0$ within the first few atomic layers penetrable by XPS. By sputtering the iron surface with low energy Ar$^+$ ions, the charge state of the iron atoms below the surface can be analyzed.[5,8] Yet, it is important to note in the context of these experiments that the high volatility and sputtering rate of oxygen can result in a reduction of the iron oxide surface.[17] With a 3 keV ion source, the iron films were reduced from the Fe$^{+3}$ charge state to Fe$^{+2}$, which has been observed by others for hematite.[46] Following previous work that conducted depth analyses of iron surfaces,[5,43] a 2 keV Ar$^+$ source was employed to conduct a depth analysis on a film that was determined by QCM to be ~15 nm thin, and by ellipsometry to be 26.7(5) nm thin, with the latter point estimate being based on measurements taken from five different spots on the film surface.

Figure 3A:
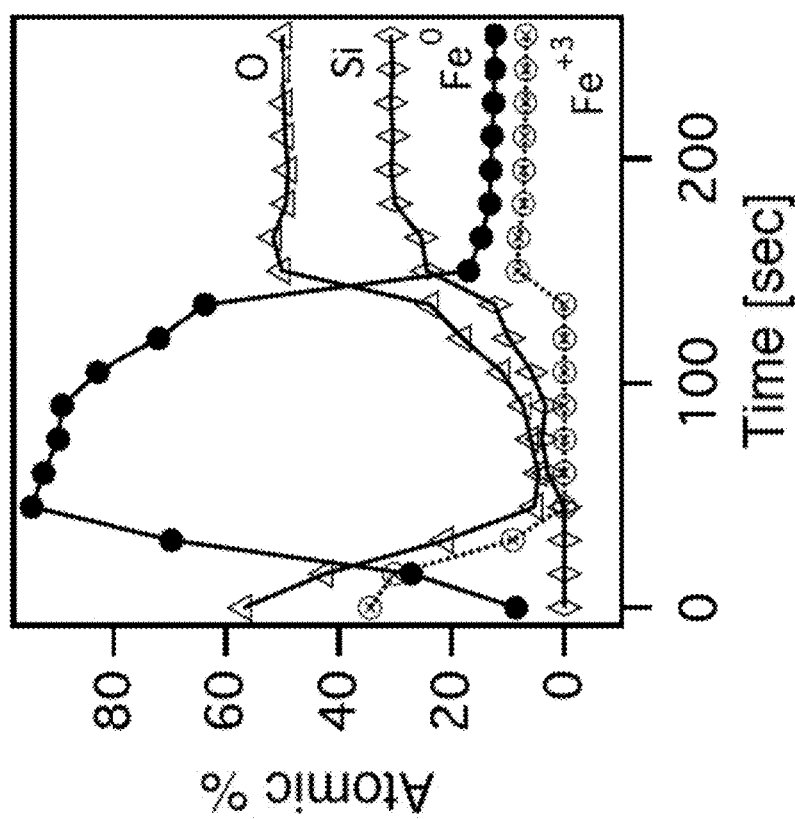
FIG. 3A. Depth profile data for a 26.7±0.5 nm iron film using a 2 keV $Ar^+$ ion source which shows change in atomic % of O, Si, $Fe^0$, and $Fe^{+3}$ as a function of sputtering time.
Figure 3B:
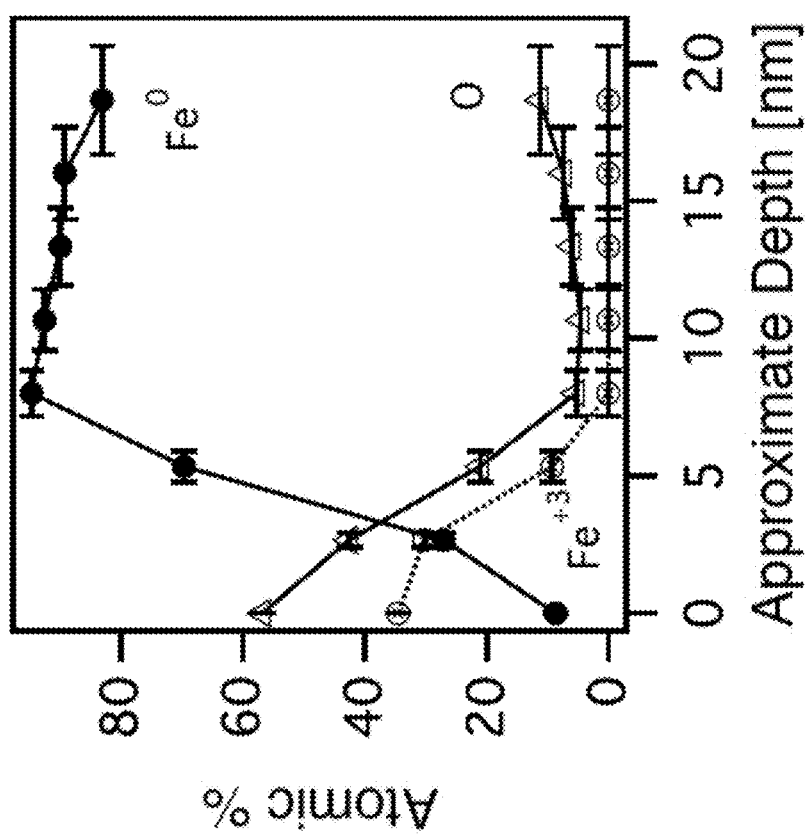
FIG. 3B. Depth profile data for a 26.7±0.5 nm iron film using a 2 keV $Ar^+$ ion source which shows change in atomic % of $Fe^0$, $Fe^{+3}$, and O as a function of calculated depth as explained in text with the error bars representative of uncertainty in depth based on time and thickness uncertainties.
Figure 3C:
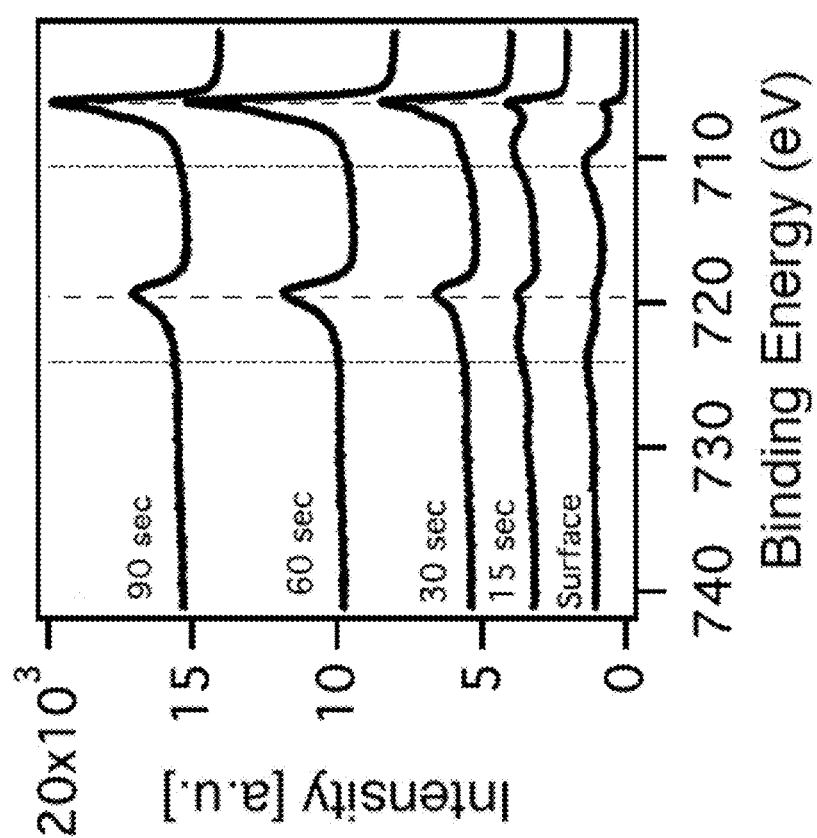
FIG. 3C. Depth profile data for a 26.7±0.5 nm iron film using a 2 keV $Ar^+$ ion source which shows Fe 2p narrow scan after various sputtering times.

The depth analysis results are shown in FIG. 3. After 150 seconds of ion etching, we find a sharp increase in Si, indicating the Ar$^+$ ions sampled the substrate at that time. While taking care not to overinterpret the data, especially given the dependence of the sputtering rate on the atomic mass and the binding energy,[47] we calculated the sputtering rate for the iron film by dividing its estimated thickness from QCM and ellipsometry by the amount of time it took to reach the silica substrate. From the calculated sputtering rate of 0.1778 nm/sec, we then plotted the atomic % of Fe$^0$, Fe$^{+3}$, and O as a function of approximate depth (FIG. 3B). (FIG. 3A shows the change in atomic percent of O, Si, Fe$^0$ and Fe$^{3+}$ as a function of sputtering time.) The uncertainty in the depth was calculated from the estimated uncertainty in the sputtering time and thickness of the film. At approximately 5 nm, the Fe$^0$ species dominates, indicating that the bulk of the iron film consists of Fe$^0$. This result is further confirmed by observing the growth of the XPS peaks at 706.5 eV and 719.5 eV, corresponding to Fe$^0$, as the sputtering time increases (FIG. 3C). Similar results were obtained for a 50 nm thin film.

Figure 4A:
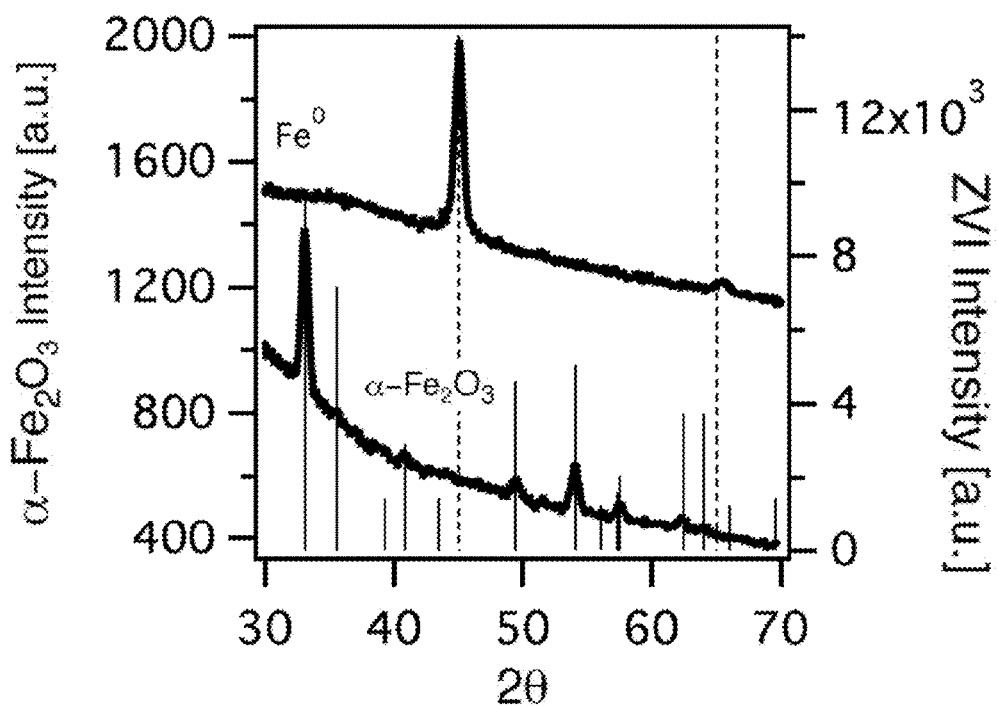
FIG. 4A. GIAXRD spectra of Zero Valent Iron (ZVI) (top) compared to $\alpha\text{-Fe}_2O_3$ (bottom). The dashed reference peaks are representative of ZVI (PDF: 00-006-0696) while the straight lines are representative of α-Fe$_2$O$_3$ (PDF: 00-033-0664).[6]

C. GIAXRD Patterns Confirm Presence of Crystalline Domains of Fe$^0$ while Broad Raman Spectral Features Indicate the Oxide Overlayer is Amorphous. To further characterize our iron films, GIAXRD spectra were taken of a 70 nm thin film deposited at a rate of approximately 0.5 nm/sec (FIG. 4A). The dashed lines represent the peaks corresponding to a reference zero valent iron (ZVI) pattern (PDF: 00-006-0696). Comparison of the GIAXRD data to those previously published for a α-Fe$_2$O$_3$ film[6] and a reference α-Fe$_2$O$_3$ pattern (PDF: 00-033-0664)[6] indicates no crystalline hematite is present in the thin iron films studied in this present work. The tabulated 2θ positions and peak intensities for α-Fe$_2$O$_3$ and ZVI are provided in the table below.

| Material/PDF | 2θ | Intensity |
| --- | --- | --- |
| α-Fe$_2$O$_3$ | 33.1523 | 100 |
| 00-033-0664 | 35.6112 | 70 |
| | 39.2756 | 3 |
| | 40.8544 | 20 |
| | 43.5177 | 3 |
| | 49.4791 | 40 |
| | 54.0892 | 45 |
| | 56.1504 | 1 |
| | 57.4276 | 5 |
| | 57.5886 | 10 |
| | 62.449 | 30 |
| | 63.9891 | 30 |
| | 66.0259 | 1 |
| | 69.5989 | 3 |
| Fe | 44.7124 | 100 |
| 00-006-0696 | 65.0818 | 20 |

A study conducted by Lai et al., examined the crystalline features of 0.25-2.0 mm Fe$^0$ filings and reported the presence of crystalline Fe$^0$ and Fe$_3$O$_4$.[48] In contrast to that study, FIG. 4A shows no crystalline iron oxide features while crystalline phases of Fe$^0$ are clearly present, and the difference is most likely due to the differences in thin film preparation.

Figure 4B:
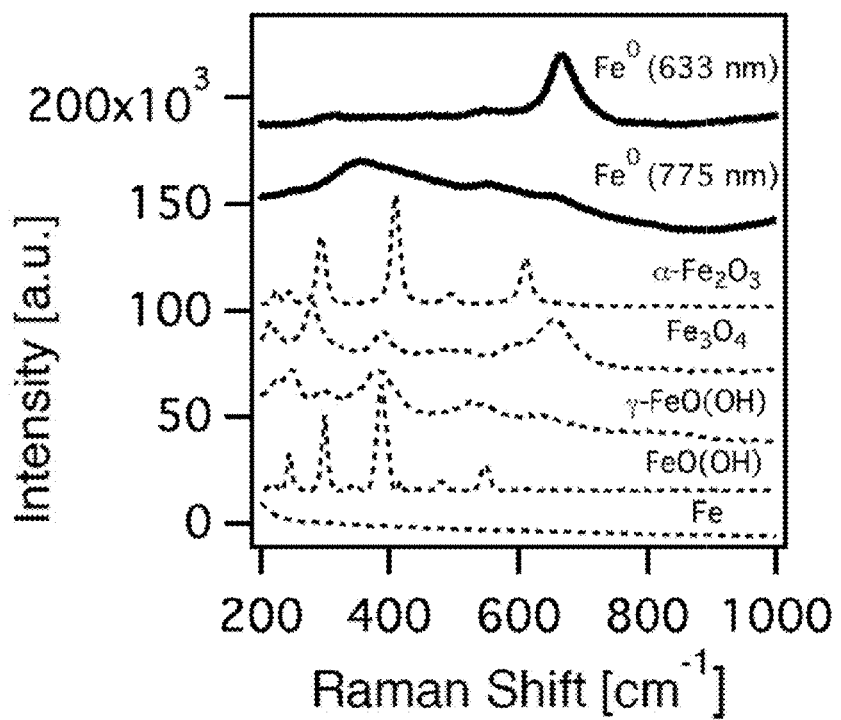
FIG. 4B. Raman spectra of ZVI films with an excitation wavelength of 633 nm and 775 nm. The hematite (RRUFF ID: R040024), magnetite (RRUFF ID: R060191), lepidocrocite (RRUFF ID: R050454), goethite (RRUFF ID: X050091), and Fe metal (RRUFF ID: R070255) spectra were obtained from the RRUFF database.[49]

FIG. 4B shows the Raman spectra obtained at an excitation wavelength of 633 and 775 nm from a 50 nm thin iron film formed using a deposition rate of 0.5 nm/sec along with reference spectra obtained from the RRUFF Database.[49] The Raman spectra of the 50 nm thick deposited ZVI film shows broad spectral features indicative of non-crystalline phases of iron oxides on the surface.[50] We find no direct match to any of the iron oxide reference spectra, indicating a mixture of Fe$^{+3}$ oxides is likely to be present within the surface layer.

D. Thin Film Hardness Exceed that of Bulk Iron by a Factor of 14. The nanoindentation measurements on the 70 nm thin iron film show well-behaved results from which hardness values of 8.5(3) GPa were obtained, which exceed those typical of bulk iron (0.6 GPa on the Vickers scale)[51] by a factor of more than 10. The iron films are also harder than the microscope glass slides, which were measured using the nanoindentation method to have a hardness of 7.1(1) GPa. The increased hardness of the nanothin iron films is attributable to the spatial restriction of the free electron gas along the height dimension of the iron film.

Figure 5C:
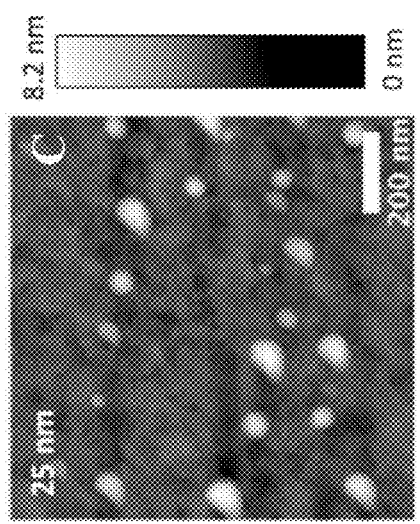
FIG. 5C. Tapping mode AFM results for a 25 nm thick ZVI film.
Figure 5B:
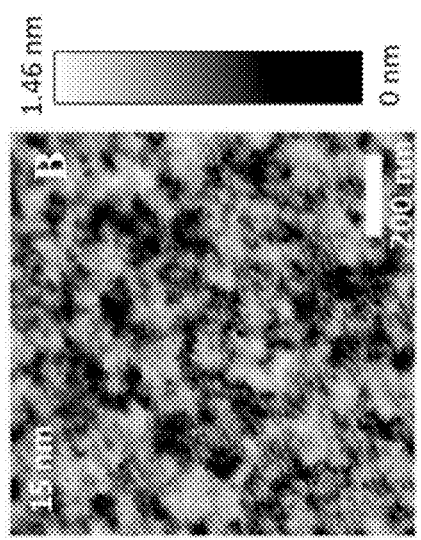
FIG. 5B. Tapping mode AFM results for a 15 nm thick ZVI film.
Figure 5E:
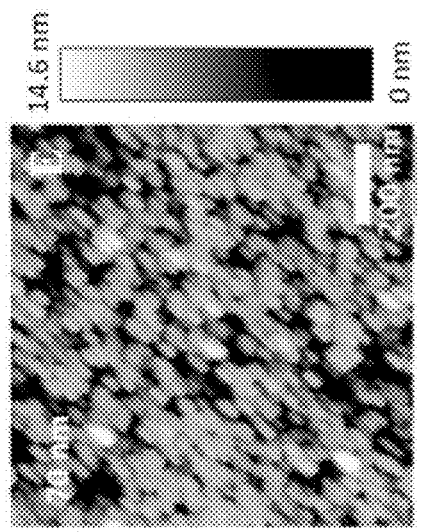
FIG. 5E. Tapping mode AFM results for a 70 nm thick ZVI film.
Figure 5D:
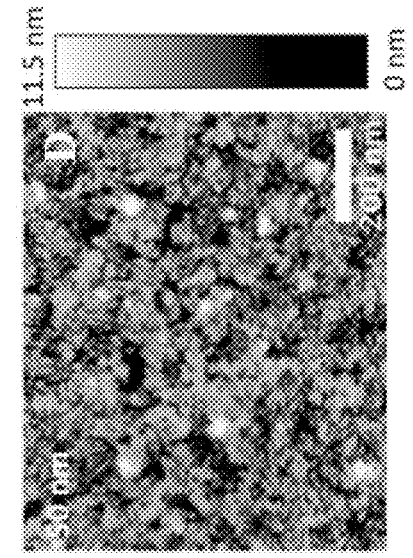
FIG. 5D. Tapping mode AFM results for a 50 nm thick ZVI film.
Figure 5A:
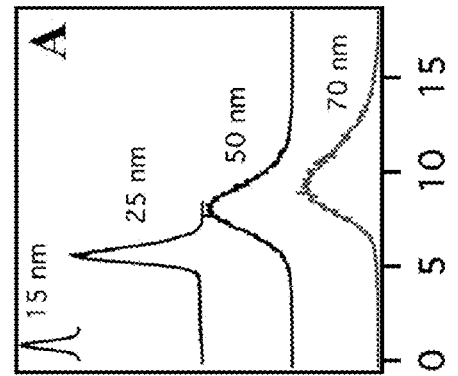
FIG. 5A. Tapping mode AFM results for four different ZVI films showing AFM height distributions.

E. AFM Images and Roughness Analysis Indicate Formation of an Optically Smooth Iron Film. To analyze the morphological structures on the surfaces of the films, AFM images were taken of samples formed using an average deposition rate of 0.5(1) nm/sec, and having thicknesses of 15, 25, 50, and 70 nm as determined by QCM. Nanoscale islands[8] are observed on the 25-70 nm thin films (FIG. 5A) with the number density of islands increasing as a function of film thickness. FIGS. 5B, 5C, 5D and 5E show the tapping mode AFM results for the 15 nm, 25 nm, 50 nm and 70 nm thick ZVI films, respectively. Two to three AFM images were taken of each sample thickness and analyzed using the Nanoscope® v. 9.0 software to calculate the average roughness ($R_a$) of each film (Table 1). This analysis shows that the film roughness increases with film thickness. This trend is reflected in a broadening of the height distributions. This observation is consistent with reports indicating that a high deposition rate leads to increased grain size and overall film roughness,[52] but it should be noted that the 15 nm thin films are considered to be atomically smooth.[53]

TABLE 1

Average roughness ($R_a$) calculated from analysis of the AFM images (1, 2, and 5 μm).

| Sample Thickness | Average Roughness ($R_a$) |
| --- | --- |
| 15 nm | 0.22 ± 0.07 nm |
| 25 nm | 0.6 ± 0.1 nm |
| 50 nm | 1.1 ± 0.03 nm |
| 70 nm | 1.9 ± 0.8 nm |

F. Iron and α-Fe$_2$O$_3$ Films Exhibit Different Nonlinear Optical Responses but Comparable Surface Charges. To quantify the interfacial electrostatics of the iron thin films, a 15 nm film was probed by the SHG $\chi^{(3)}$ method under aqueous flow conditions, followed by comparison to our previous work on α-Fe$_2$O$_3$.[6] The smoothest film (15 nm) was chosen due to the absence of nanoscale islands according to AFM. The thin films studied here are semitransparent and gray (see TOC graphic) while the α-Fe$_2$O$_3$ is a semitransparent orange film resulting in different optical properties in the two bulk materials, which is an important consideration for nonlinear optical signal generation from them. To evaluate the nature of the signal recorded at 2ω, a series of important control studies were performed. FIG. 6A shows the SHG signal intensity as a function of input energy with the filled circles representative of ZVI and the open circles representative of α-Fe$_2$O$_3$.[6] The expected quadratic power dependence of the SHG process[26] is observed to break down above pulse energies of 0.33 μJ for the iron thin films studied here. In contrast, the α-Fe$_2$O$_3$ films produce the expected quadratic dependence of SHG intensity on input energy throughout the entire range of pulse energies surveyed.[6] FIG. 6A also shows that the SHG intensity is four times larger for the thin iron films upon optical breakdown as compared to the α-Fe$_2$O$_3$ films at the same input energy (0.33 μJ), indicating differences in the bulk nonlinear optical properties.

The polarization and wavelength dependence of the signal collected at 2ω was determined next. FIG. 6B shows that signals are well polarized along the plane of incidence when probing with fundamental light plane-polarized along the plane of incidence, while FIG. 6C shows that the signal at 2ω has a bandwidth expected for the second harmonic of a 120 fsec long fundamental probe pulse at 600 nm, with no indication of fluorescence. The data shown in FIGS. 6A-C indicate well-behaved SHG behavior.

Figure 6D:
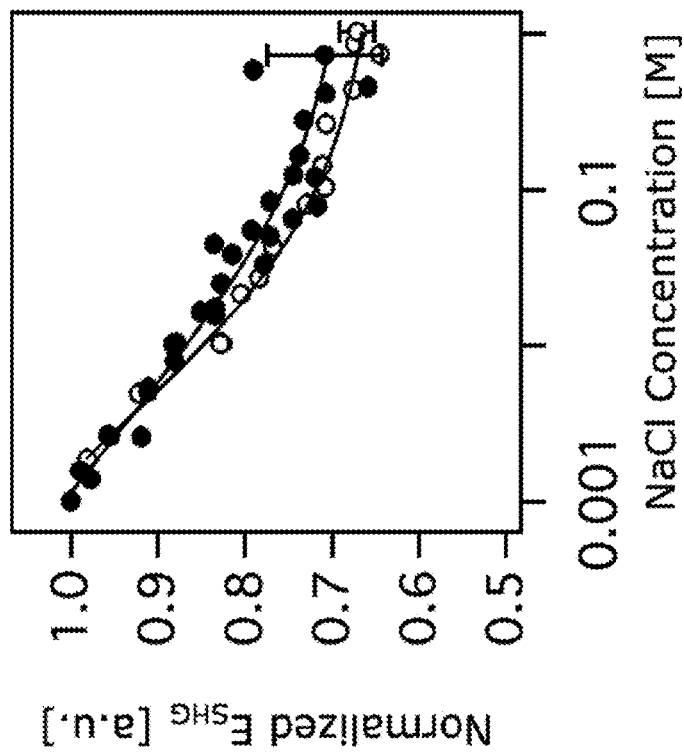
FIG. 6D. SHG response of ZVI films (colored circles) in the presence of pH 7 Millipore water and α-Fe$_2$O$_3$ (empty circles) in the presence of pH 4 Millipore water (300 nm SHG) as a function of NaCl concentration fit to the Gouy-Chapman equation.
Figure 6C:
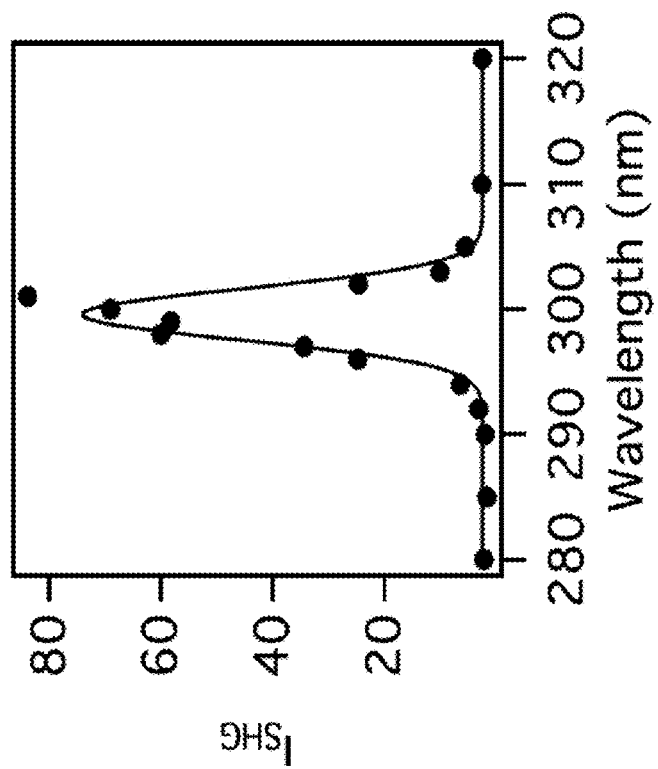
FIG. 6C. SHG response of ZVI films (colored circles) in the presence of pH 7 Millipore water and α-Fe$_2$O$_3$ (empty circles) in the presence of pH 4 Millipore water (300 nm SHG) as a function of monochromator wavelength.

To further investigate nature of the Fe$^{+3}$ overlayer on the iron thin film, a charge screening experiment was conducted on the iron thin film by monitoring the SHG intensity as a function of NaCl concentration added to an aqueous solution held at pH 4 (FIG. 6D). The surface charge density calculated by fitting the data to Eq. 2 was found to be −0.007(3) C/m$^2$ at pH 7, which is within range of the interfacial charge density obtained in earlier work for α-Fe$_2$O$_3$, −0.005(1) C/m$^2$.[6] The spectroscopic data collected here show that (1) the surface of the iron thin films have similar surface charge properties to that of Fe$^{+3}$ and (2) the films fabricated here can be efficiently studied using SHG spectroscopy.

IV. Conclusions

Chemically pure 15, 25, 50, and 75 nm thin iron films, were synthesized by electron beam deposition from inexpensive and readily available iron sources of 3N5 purity. It was shown that chemical purity of the thin films, quantified using XPS scans between 0 and 1200 eV, was achieved by increasing the mean deposition rate such that the melting point of iron was reached at the iron source surface. XPS data indicate that the iron films are coated with a 3 nm thin overlayer of Fe$^{3+}$, which comprises Fe$_3$O$_4$, and other forms of iron oxide as indicated by Raman and XPS spectroscopy. Grazing incidence angle X-Ray diffraction experiments indicate the presence of crystalline Fe$^0$ with low index faces exposed but no crystallinity of the iron oxide overlayer. Atomic force microscopy of the iron film surfaces indicates narrowing and shifts to lower heights in the height distribution of nanoscale features formed during the film deposition process as the film thickness decreases. Second harmonic generation was then used to determine that the interfacial charge density of the thinnest (15 nm) iron film is −0.007(3) C/m$^2$ at pH 7. The approach presented here is applicable to iron sources of even lower purity.

V. Supplemental Details for the Example

Film Oxidation Over Time.

Fe$^0$ quickly oxidizes to Fe$^{+2}$ and Fe$^{+3}$ under ambient conditions as shown in Eqns. 1-3 below. Further, pure metals form "passive" oxide layers in the presence of water that protect from further corrosion of the bulk metal.

$$2Fe^0 + O_2 + 2H_2O \rightarrow 2Fe^{+2} + 4OH^-$$ [1]

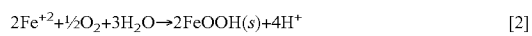
$$2Fe^{+2} + \tfrac{1}{2}O_2 + 3H_2O \rightarrow 2FeOOH(s) + 4H^+$$ [2]

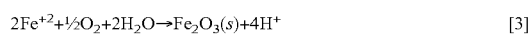
$$2Fe^{+2} + \tfrac{1}{2}O_2 + 2H_2O \rightarrow Fe_2O_3(s) + 4H^+$$ [3]

In this work, the fabricated Fe$^0$ films were stored under ambient conditions allowing for oxidation of the surface. The oxidation state of the surface of the film was studied over time by collecting XPS spectra shortly after deposition and over a 96 hour time period. Using the Avantage v.5 software to fit peaks, atomic percentages of Fe$^{+3}$, Fe$^0$, and O were calculated for each spectra collected. For the 1 and 96 hour reported percentages, three spectra were fit from three different points on the film and the percentages were averaged together. For the 70 hour percentages, two different points were examined and only one point was examined for the 52 hour percentages. The concentration of Fe$^{+3}$, Fe$^0$, and O were invariant across the 96 hour time period indicating immediate oxidation upon exposure to ambient conditions and formation of a passivation layer.

Destabilization of Passivation Layer in the Presence of Aqueous NaCl Solutions.

During the nonlinear optical studies, the iron thin films were exposed to pH 7 Millipore water and increasing NaCl concentrations up to 0.7 M under flow conditions (1 mL/sec) for three full days and a total of approximately 30 hours. In addition to the salt exposure, the films were also exposed to an additional day (10 hour) under pH 7 flow conditions. Chloride ions have been found to destabilize the passivating film and increase the rate of corrosion. In addition, at pH 7 dissolved CO$_2$, with the dominant form existing as HCO$^{3-}$, has the potential to adsorb to the surface of iron oxides forming carbonato-iron oxide species. The XPS spectra in the carbon and oxygen binding region show the dominant peaks associated with the primary species, but also a peak in the higher binding region indicative of metal carbonate species.

In order to determine how the aqueous conditions affected the charge state of the bulk iron a depth analysis was conducted using XPS. The O, Fe$^{+3}$, and Fe$^0$ species were studied as a function of sputtering time with a 2 keV Ar$^+$ ion gun. While the sputtering rate of pure metals can be easily determined due to the clear crater that is formed, sputtering rates of mixed phase oxides are much harder to quantify due to the different bond energies present within the different oxide phases. Although the actual depth could not be quantified, the Fe$^0$ is still present beneath a thicker passivation layer leading to the conclusion that the chloride ions destabilized the passivation layer and the carbonate species adsorbed to the iron oxide surface.

The word "illustrative" is used herein to mean serving as an example, instance, or illustration. Any aspect or design described herein as "illustrative" is not necessarily to be construed as preferred or advantageous over other aspects or designs.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

REFERENCES (1) Homann, K.; Freund, H. J. N2 Adsorption and Dissociation on Thin Iron Films on W(110). *Surface Science* 1995, 327, 216-24.

(2) Fu, F.; Dionysiou, D. D.; Liu, H. The Use of Zero-Valent Iron for Groundwater Remediation and Wastewater Treatment: A Review. *Journal of Hazardous Materials* 2014, 267, 194-205.

(3) Thielemann, P.; Brandt, U. Magentooptical Studies on Thin Iron Films. *Appl. Phys. A* 1982, 28, 53-8.

(4) Gerhard, L.; Yamada, T. K.; Balashov, T.; Takacs, A. F.; Wesselink, R. J. H.; Daene, M.; Fechner, M.; Ostanin, S.; Ernst, A.; Mertig, I. et al. Magnetoelectric Coupling at Metal Surfaces. *Nature Nanotechnology* 2010, 5, (5) Okoshi, M.; Awaihara, Y.; Yamashita, T.; Inoue, N. F2-Laser-Induced Surface Modification of Iron Thin Films to Obtain Corrosion Resistance. *Japanese Journal of Applied Physics* 2014, 53, (6) Jordan, D. S.; Hull, C. J.; Troiano, J. M.; Riha, S. C.; Martinson, A. B. F.; Rosso, K. M.; Geiger, F. M. Second Harmonic Generation Studies of Fe(Ii) Interactions with Hematite (Alpha-Fe2o3). *Journal of Physical Chemistry C* 2013, 117, 4040-7.

(7) Cornell, R. M.; Schwertmann, U. *The Iron Oxides;* 2nd Edition ed.; Wiley, 2003.

(8) Wang, W. T.; Guan, D. Y.; Yang, G.; Yang, G. Z.; Zhou, Y. L.; Lu, H. B.; Chen, Z. H. Nonlinear Optical Properties of Thin Iron Films Grown on Mgo (100) by Pulsed Laser Deposition. *Thin Solid Films* 2005, 471, 86-90.

(9) Yoshida, N.; Fujita, F. E. Influence of Oxygen on Vacuum Deposited Iron Thin Film. *J. Phys. F.: Metal Phys.* 1972, 2,

(10) Piras, F. M.; Rossi, A.; Spencer, N. D. Growth of Tribological Films: In Situ Characterization Based on Attenuated Total Reflection Infrared Spectroscopy. *Langmuir* 2002, 18, 6606-13.

(11) Lowndes, D. H.; Geohegan, D. B.; Puretzky, A. A.; Norton, D. P.; Rouleau, C. M. Synthesis of Novel Thin-Film Materials by Pulsed Laser Deposition. *Science* 1996, 273, 898+.

(12) Reichelt, K.; Jiang, X. The Preparation of Thin-Films by Physical Vapor-Deposition Methods. *Thin Solid Films* 1990, 191, 91-126.

(13) Nagano, M.; Hayashi, Y.; Ohtani, N.; Isshiki, M.; Igaki, K. Hydrogen Diffusivity in High-Purity Alpha-Iron. *Scripta Metallurgica* 1982, 16, 973-6.

(14) Lesker, K. J. In MSDS No: M-1000-155 [Online] Pennsylvania

(15) Heycock, C. T.; Lamplough, F. E. E. The Boiling Points of Mercury, Cadmium, Zinc, Potassium, and Sodium. *Proceedings of the Chemical Society, London* 1913, 28, 3.

(16) Takayanagi, N.; Akihama, K.; Kizaki, Y. U.S.A., 1992.

(17) Yin, L. I.; Ghose, S.; Adler, I. X-Ray Photoelectron Spectroscopic Studies of Valence States Produced by Ion-Sputtering Reduction. *Applied Spectroscopy* 1972, 26, 355-&.

(18) Wang, Y.; Raabe, D.; Klüber, C.; Roters, F. Orientation Dependence of Nanoindentation Pile-up Patterns and of Nanoindentation Microtextures in Copper Single Crystals. *Acta Materialia* 2004, 52, 2229-38.

(19) Cimatu, K.; Baldelli, S. Spatially Resolved Surface Analysis of an Octadecanethiol Self-Assembled Monolayer on Mild Steel Using Sum Frequency Generation Imaging Microscopy. *Journal of Physical Chemistry C* 2007, 111, 7137-43.

(20) Hosseinpour, S.; Hedberg, J.; Baldelli, S.; Leygraf, C.; Johnson, M. Initial Oxidation of Alkanethiol-Covered Copper Studied by Vibrational Sum Frequency Spectroscopy. *J. Phys. Chem. C* 2011, 115, 23871-9.

(21) Hedberg, J.; Baldelli, S.; Leygraf, C. Evidence for the Molecular Basis of Corrosion of Zinc Induced by Formic Acid Using Sum Frequency Generation Spectroscopy. *J. Phys. Chem. Lett.* 2010, 1, 1679-82.

(22) Eisenthal, K. B. Liquid Interfaces Probed by Second-Harmonic and Sum-Frequency Spectroscopy. *Chem. Rev.* 1996, 96, 1343-60.

(23) Zhao, X.; Ong, S.; Wang, H.; Eisenthal, K. B. New Method for Determination of Surface Pka Using Second Harmonic Generation. *Chemical Physics Letters* 1993, 214,

(24) Shen, Y. R. Surface Properties Probed by Second-Harmonic and Sum-Frequency Generation. *Nature* 1989, 337,

(25) Shen, Y. R. *The Principles of Nonlinear Optics*; John Wiley and Sons: New York, 1984.

(26) Boyd, R. W. *Nonlinear Optics*; Academic Press: Rochester, N. Y., 2008; Vol. 3.

(27) Hayes, P. L.; Malin, J.; Jordan, D. S.; Geiger, F. M. Get Charged Up: Nonlinear Optical Voltammetry for Quantifying the Thermodynamics and Electrostatics of Metal Cations at Aqueous/Oxide Interfaces. *Chemical Physics Letters* 2010, 499, 183-92.

(28) Jena, K. C.; Covert, P. A.; Hore, D. K. The Effect of Salt on the Water Structure at a Charged Solid Surface: Differentiating Second- and Third-Order Nonlinear Contributions. *J. Phys. Chem. Letters* 2011, 2, 1056-61.

(29) Stumm, W.; Morgan, J. J. *Aquatic Chemistry, Chemical Equilibria and Rates in Natural Waters*; John Wiley & Sons: New York, 1996.

(30) Morel, F. M. M.; Hering, J. G. *Principles and Applications of Aquatic Chemistry*; John Wiley & Sons Inc.: New York, N.Y., 1993.

(31) Langmuir, D. *Aqueous Environmental Geochemistry*; Prentice Hall: New Jersey, 1997.

(32) T., K. C.; Musorrafiti, M. J.; Al-Abadleh, H. A.; Bertin, P. A.; Nguyen, S. T.; Geiger, F. M. Interfacial Acidities, Charge Densities, Potentials, and Energies of Carboxylic Acid Functionalized Silica/Water Interfaces Determined by Second Harmonic Generation. *J. Am. Chem. Soc.* 2004, 126,

(33) Al-Abadleh, H. A.; Mifflin, A. L.; Bertin, P. A.; Nguyen, S. T.; Geiger, F. M. Control of Carboxylic Acid and Ester Groups on Chromium (Vi) Binding to Functionalized Silica/Water Interfaces Studied by Second Harmonic Generation. *J. Phys. Chem. B* 2005, 109, 9691-702.

(34) Malin, J. N.; Geiger, F. M. Uranyl Adsorption and Speciation at the Fused Silica/Water Interface Studied by Resonantly Enhanced Second Harmonic Generation and the Chi(3) Method. *J. Phys. Chem. A* 2010, 114, 1797-805.

(35) Gomez, S. A. S.; Jordan, D. S.; Troiano, J. M.; Geiger, F. M. Uranyl Adsorption at the Muscovite (Mica)/Water Interface Studied by Second Harmonic Generation. *Abstracts of Papers of the American Chemical Society* 2013, 245,

(36) Gomez, S. A. S.; Jordan, D. S.; Troiano, J. M.; Geiger, F. M. Uranyl Adsorption at the Muscovite (Mica)/Water Interface Studied by Second Harmonic Generation. *Environmental Science & Technology* 2012, 46, 11154-61.

(37) Malin, J., Northwestern University, 2011.

(38) In *Avantage XPS Processing*; ThermoScientific: 2014.

(39) Sarkar, J. In *Sputtering Materials for Vlsi and Thin Film Devices*; Sarkar, J., Ed.; William Andrew Publishing: Boston, 2014, p 93-170.

(40) Jones, H. A.; Langmur, I.; Mackay, G. M. J. The Rates of Evaporation and the Vapor Pressures of Tungsten, Molybdenum, Platinum, Nickel, Iron, Copper and Silver. *Phys. Rev.* 1927, 30, 201-14.

(41) Kodigala, S. R. *Thin Film Solar Cells from Earth Abundant Materials: Growth and Characterization of Cu2znsn(Sse)4 Thin Films and Their Solar Cells*; Elsevier: London, 2014.

(42) Szalkowski, F. J. The Characterization of Surfaces by Electron Spectroscopy. *Journal of Colloid and Interface Science* 1977, 58, 199-215.

(43) Graat, P. C. J.; Somers, M. A. J. Simultaneous Determination of Composition and Thickness of Thin Iron-Oxide Films from Xps Fe 2p Spectra. *Applied Surface Science* 1996, 100/101, 36-40.

(44) Qui, S. R.; Lai, H.-F.; Roberson, M. J.; Hunt, M. L.; Amrhein, C.; Giancarlo, L. C.; Flynn, G. W.; Yarmoff, J. A. Removal of Contaminants from Aqueous Solution by Reaction with Iron Surfaces. *Langmuir* 2000, 16, 2230-6.

(45) Aronniemi, M.; Lahtinen, J.; Hautojarvi, P.; 8 ed.; Wiley Deutsche Forschungsgemeinschaft e.V. (DFG) Deutsche Forschungsgemeinschaft e.V. (DFG): Place of Publication: Berlin, Germany. Country of Publication: UK.; Vol. 36, p 1004-6.

(46) Suzuki, S.; Sugiyama, K.; Waseda, Y. Changes in the Chemical State and Composition of the Surface of Iron Oxides Due to Argon Ion Sputtering. *Journal of Surface Analysis* 2002, 9,

(47) Liang, X.; Wang, X.; Miao, E. L.; Zheng, J. J.; Wang, F.; Wang, G. W.; Gu, Y. Q. An Investigation on the Removal Characteristics of Compound Materials During Ion Beam Sputtering Using the Kinetic Monte Carlo Method. *Nucl. Instrum. Methods Phys. Res. Sect. Beam Interact. Mater. Atoms* 2014, 323, 1-6.

(48) Lai, K. C. K.; Lo, I. M. C. Removal of Chromium (Vi) by Acid-Washed Zero-Valent Iron under Various Groundwater Geochemistry Conditions. *Environ. Sci. Technol.* 2008, 42, 1238-44.

(49) Down, R. T. In *Program and Abstracts of the 19th General Meeting of the International Mineralogical Association* Kobe, Japan, 2006.

(50) de Faria, D. L. A.; Silva, S. V.; de Oliveira, M. T. Raman Microspectroscopy of Some Iron Oxides and Oxyhydroxides. *Journal of Raman Spectroscopy* 1997, 28, 873-8.

(51) Samsonov *Handbook of the Physicochemical Properties of the Elements*; ICEPlenum: New York, USA, 1968.

(52) Bordo, K.; Rubahn, H.-G. Effect of Deposition Rate on Structure and Surface Morphology of Thin Evaporated Al Films on Dielectrics and Semiconductors. *Materials Science-Medziagotyra* 2012, 18, 313-7.

(53) Luo, Y.; Yee, N.; Shi, Q. F.; Zhang, B. X.; Mo, Y. B.; Chottiner, G. S.; Scherson, D. A. Topographical and Electrochemical Characterization of Optically Smooth Zn Films Prepared by Physical Vapor Deposition. *Journal of the Electrochemical Society* 2001, 148, E295-E7.

What is claimed is:

1. A method of forming an iron film on a deposition substrate, the method comprising:
directing an electron beam onto the surface of an iron source comprising 99.98 atomic percent, or less, of iron; the remainder of the iron source comprising impurity elements having boiling points lower than that of the iron at the deposition conditions;
wherein the electron beam heats the surface of the iron source to a temperature above its melting point, such that at least a portion of the surface of the iron source melts and iron and impurities from the melted iron source evaporate into the gas phase and then deposit as a solid film on a surface of the deposition substrate; and
further wherein the temperature to which the iron source is heated by the electron beam is high enough that the concentration of the impurities in the gas phase is the same as, or lower than, the concentration of the impurities in the iron source, so that the solid film deposited on the deposition substrate has an impurity concentration that is the same as, or lower than, that of the iron source.

2. The method of claim 1, wherein the temperature to which the iron source is heated by the electron beam is high enough that the concentration of the impurities in the gas phase is lower than the concentration of the impurities in the iron source, so that the solid film deposited on the deposition substrate has an impurity concentration that is lower than that of the iron source.

3. The method of claim 1, wherein the solid film is deposited at a mean deposition rate of at least 0.3 nm/s.

4. The method of claim 1, wherein the solid film is deposited at a mean deposition rate of at least 0.5 nm/s.

5. The method of claim 1, wherein the iron source comprises about 99.95 atomic percent iron, or less.

6. The method of claim 1, wherein the impurity elements having boiling points lower than that of iron comprise zinc, one or more alkali elements, or combinations thereof.

7. The method of claim 1, wherein the impurity elements having boiling points lower than that of iron comprise zinc and sodium and further wherein the zinc and sodium are both present in the iron source at concentrations of at least 0.1 ppm by weight.

8. The method of claim 1, wherein the solid film comprises a plurality of crystalline iron domains.

9. The method of claim 1, wherein the solid film has a thickness of no greater than about 100 nm.

10. The method of claim 1, further comprising exposing the solid film to an oxidizing environment to form an amorphous iron oxide overlayer comprising iron(III) oxide on the solid film.

11. The method of claim 10, wherein the solid film has a thickness of no greater than about 75 nm and the amorphous iron oxide overlayer has a thickness of no greater than about 3 nm.

12. The method of claim 10, wherein the amorphous iron oxide overlayer is free of crystalline iron oxide phases.

13. The method of claim 12, wherein the total thickness of the solid film and the amorphous iron oxide overlayer is no greater than about 15 nm and an average surface roughness of the amorphous iron oxide overlayer is no greater than about 0.3 nm.

14. The method of claim 1, wherein the iron source comprises 99.95 atomic percent, or less, of iron and the remainder of the iron source comprises the impurity elements, and further wherein the solid film deposited on the deposition substrate comprises at least 0.01000 atomic percent more iron than the iron source.

15. The method of claim 14 wherein the solid film deposited on the deposition substrate comprises at least 0.03000 atomic percent more iron than the iron source.

16. The method of claim 14, wherein the solid film is deposited in a vacuum chamber with a background pressure $9 \times 10^{-6}$ Torr or lower, using an electron beam deposition current in the range from 30 mA to 140 mA and an electron beam wattage in the range from about 150 to about 665 watts.

17. A method of forming a metal film on a deposition substrate, the method comprising:
directing an electron beam onto the surface of a metal source comprising 99.98 atomic percent, or less, of a source metal element to be deposited; the remainder of the metal source comprising impurity elements having boiling points lower than that of the source metal element at the deposition conditions;

wherein the electron beam heats the surface of the metal source to a temperature above its melting point, such that at least a portion of the surface of the metal source melts and source metal and impurities from the melted metal source evaporate into the gas phase and then deposit as a solid film on a surface of the deposition substrate; and further wherein the temperature to which the metal source is heated by the electron beam is high enough that the concentration of the impurities in the gas phase is the same as, or lower than, the concentration of the impurities in the metal source, so that the solid film deposited on the deposition substrate has an impurity concentration that is the same as, or lower than, that of the metal source.

18. The method of claim 17, wherein the temperature to which the metal source is heated by the electron beam is high enough that the concentration of the impurities in the gas phase is lower than the concentration of the impurities in the metal source, so that the solid film deposited on the deposition substrate has an impurity concentration that is lower than that of the metal source.

19. The method of claim 17, wherein the solid film is deposited at a mean deposition rate of at least 0.3 nm/s.

20. The method of claim 17, wherein the source metal element is selected from platinum, palladium, iridium, tungsten, rhodium, gold and osmium.

21. The method of claim 7, wherein the solid film deposited on the deposition substrate has a zinc impurity concentration and a sodium impurity concentration that are lower than that of the iron source.

22. The method of claim 1, wherein the impurity elements having boiling points lower than that of iron comprise zinc and the solid film deposited on the deposition substrate has a zinc impurity concentration that is lower than that of the iron source.

23. The method of claim 1, wherein the impurity elements having boiling points lower than that of iron comprise sodium and the solid film deposited on the deposition substrate has a sodium impurity concentration that is lower than that of the iron source.

* * * * *